United States Patent [19]
Olesen et al.

[11] Patent Number: 5,950,645
[45] Date of Patent: Sep. 14, 1999

[54] SEMICONDUCTOR WAFER CLEANING SYSTEM

[75] Inventors: Michael B. Olesen, Yorba Linda; Mario E. Bran, Garden Grove, both of Calif.

[73] Assignee: Verteq, Inc., Santa Ana, Calif.

[21] Appl. No.: 08/910,033

[22] Filed: Aug. 11, 1997

Related U.S. Application Data

[63] Continuation-in-part of application No. 08/361,139, Dec. 21, 1994, Pat. No. 5,656,097, which is a continuation-in-part of application No. 08/140,290, Oct. 20, 1993, abandoned.

[51] Int. Cl.⁶ ..................... B08B 3/10
[52] U.S. Cl. .............. 134/98.1; 134/100.1; 134/113; 134/184; 134/186; 134/902
[58] Field of Search .................. 134/184, 186, 134/902, 155, 113, 98.1, 100.1

[56] References Cited

U.S. PATENT DOCUMENTS

| | | |
|---|---|---|
| 2,961,354 | 11/1960 | Cleveland . |
| 3,690,333 | 9/1972 | Kierner . |
| 3,893,869 | 7/1975 | Mayer et al. . |
| 4,193,818 | 3/1980 | Young et al. . |
| 4,409,999 | 10/1983 | Pedziwiatr .............................. 134/184 |
| 4,577,650 | 3/1986 | McConnell . |
| 4,633,893 | 1/1987 | McConnell et al. . |
| 4,652,334 | 3/1987 | Jain et al. . |
| 4,736,760 | 4/1988 | Coberly et al. . |
| 4,738,272 | 4/1988 | McConnell . |
| 4,740,249 | 4/1988 | McConnell . |
| 4,778,532 | 10/1988 | McConnell et al. . |
| 4,795,497 | 1/1989 | McConnell et al. . |
| 4,856,544 | 8/1989 | McConnell . |
| 4,899,767 | 2/1990 | McConnell et al. . |
| 4,911,761 | 3/1990 | McConnell et al. . |
| 4,917,123 | 4/1990 | McConnell et al. . |
| 4,984,597 | 1/1991 | McConnell et al. . |
| 5,069,235 | 12/1991 | Vetter et al. ............................ 134/902 |

(List continued on next page.)

FOREIGN PATENT DOCUMENTS

| | | | |
|---|---|---|---|
| 64-57721 | 3/1989 | Japan | ..................................... 134/902 |
| 1-189127 | 7/1989 | Japan | ..................................... 134/902 |
| 1-246835 | 10/1989 | Japan | ..................................... 134/902 |
| 2-109334 | 4/1990 | Japan | ..................................... 134/902 |
| 2-117135 | 5/1990 | Japan | ..................................... 134/902 |
| 1776463 | 11/1992 | U.S.S.R. | ................................ 134/184 |

OTHER PUBLICATIONS

Copy of an article by Werner Kern, entitled "The Evolution of Silicon Water Cleaning Technology", J. Electrochem. Soc., vol. 137, No. 6, Jun. 1990.

Copy of an article by S. Verhaverbeke, et al., entitled "Advanced Wet Cleaning Technology For Highly Reliable Thin Oxides", Nov. 1993.

Copy of an article by Peter H. Singer, entitled "Trends in Wafer Cleaning", Semiconductor International, Dec. 1992.

*Primary Examiner*—Frankie L. Stinson
*Attorney, Agent, or Firm*—Knobbe, Martens, Olson & Bear LLP

[57] ABSTRACT

Semiconductor wafers are positioned in a cleaning tank and subjected to sequential flows of one or more highly diluted cleaning solutions that are injected into the lower end of the tank and allowed to overflow at the upper end. One solution comprises one part ammonium hydroxide, two parts hydrogen peroxide, and 300–600 parts deionized water together with a trace of high purity surfactant. Rinsing water is flowed through the tank after the first solution is dumped. A second solution comprises highly dilute hydrofluoric acid. A third solution is more dilute than the first solution. A fourth solution contains hydrochloric acid greatly diluted with deionized water. The solutions are initiated either by injecting the chemicals into an incoming DI water line or directly into the tank. The cleaning tank is provided with a megasonic generator in its lower portion for selective application of megasonic energy. Quick dump valves in the tank bottom enable the solutions to be quickly dumped followed by one or more rinse steps, including a quick refill while spraying and then dumping of the rinsing water.

9 Claims, 10 Drawing Sheets

U.S. PATENT DOCUMENTS

| | | |
|---|---|---|
| 5,100,476 | 3/1992 | Mase et al. . |
| 5,143,103 | 9/1992 | Basso et al. . |
| 5,148,823 | 9/1992 | Bran .......................................... 134/186 |
| 5,265,632 | 11/1993 | Nishi ........................................ 134/902 |
| 5,275,184 | 1/1994 | Nishizawa et al. ....................... 134/186 |
| 5,302,311 | 4/1994 | Sugihara et al. . |
| 5,308,400 | 5/1994 | Chen . |
| 5,456,759 | 10/1995 | Stanford, Jr. et al. . |
| 5,656,097 | 8/1997 | Olesen et al. . |

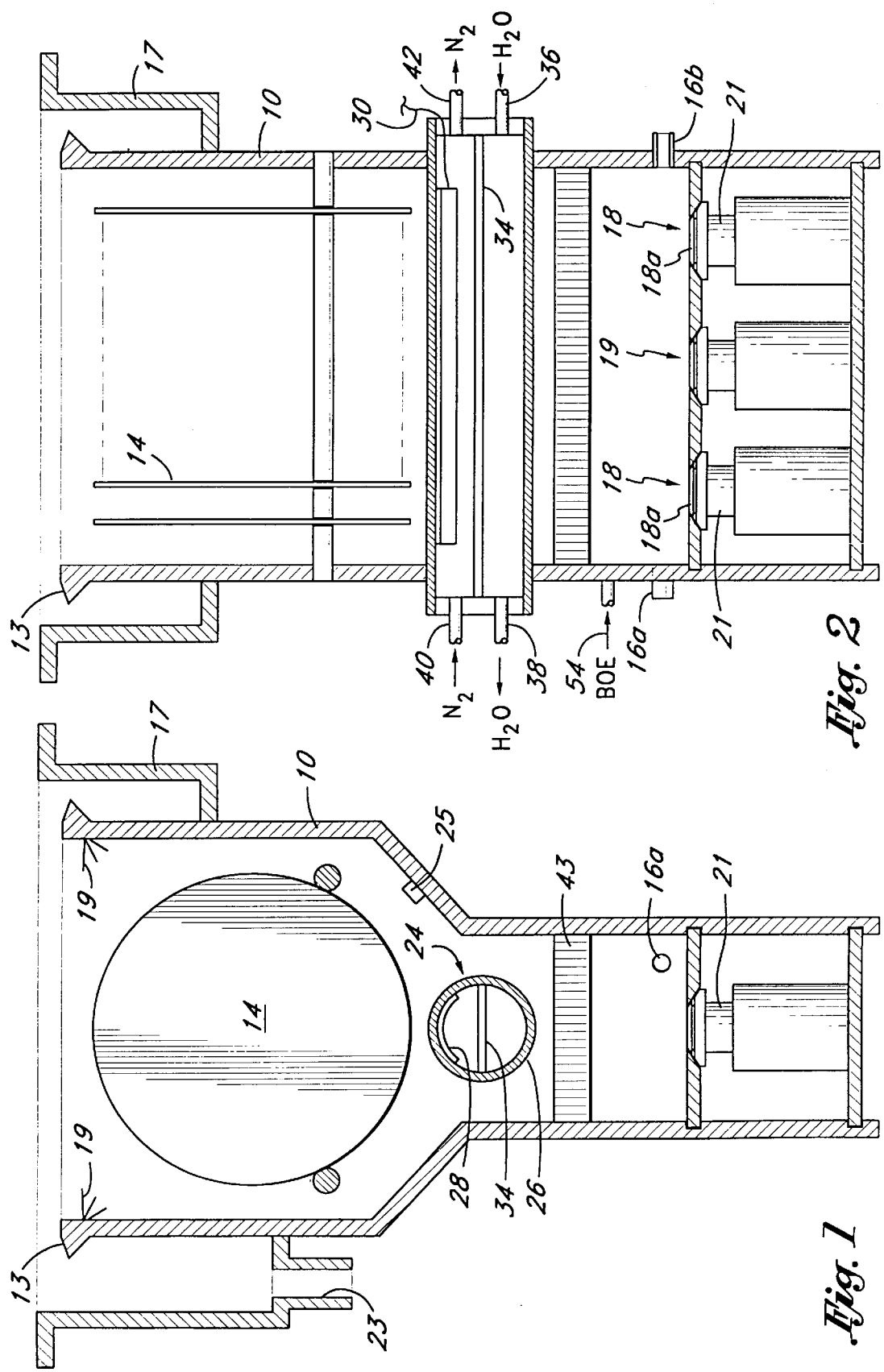

| VcS CYCLE | FINAL MIXED RATIO | FOR EACH CHEMICAL | BATH TEMP. AT END OF CYCLE |
|---|---|---|---|
| Vc1 CYCLE | 300-600 : 2 : 1 + 14ppm SURFACTANT | ($H_2O$ : $H_2O_2$ : $NH_4OH$) | 60°C |
| Vc2 CYCLE | 100 : 1 | ($H_2O$ : BOE) | 30°C |
| Vc3 CYCLE | 1000 : 5 : 1 + 20ppm SURFACTANT | ($H_2O$ : $H_2O_2$ : $NH_4OH$) | 60°C |
| Vc4 CYCLE | 1000 : 1 | ($H_2O$ : HCL) | 45°C |

SEMICONDUCTOR WAFER CLEANING SYSTEM

RELATED APPLICATION

This is a continuation-in-part of U.S. Patent Application, Ser. No. 08/361,139, filed Dec. 21, 1994, now U.S. Pat. No. 5,656,097 which is a continuation-in-part of Application, Ser. No. 08/140,290, filed Oct. 20, 1993, now abandoned.

FIELD OF THE INVENTION

This invention relates to methods and apparatus for cleaning semiconductor wafers and the like.

BACKGROUND OF THE INVENTION

In the fabrication of semiconductor wafers used in making a variety of semiconductor circuit devices, the importance of minimizing contamination on the wafers has been recognized since the early days of the industry. However, as the end product devices have become more and more miniaturized and complex, the cleanliness requirements have become increasingly more stringent so that the devices will function properly. With the reduced size of the devices, a contaminant occupies an increased percentage of the available space for current elements, and hence cleanliness of the materials becomes far more critical.

As the devices become more complex, they also become more valuable, such that unsatisfactory products represent a very significant loss of revenue. A cassette load of large diameter wafers may have an end process value of as much as a million dollars. Also, there is the cost incident to unusable end products that might arise as a result of the discovery of unsatisfactory semiconductor devices after their combination with other components.

In addition to the foregoing cost, there are the major expenses associated with the cleaning processes themselves. One of the major capital expenditure is in the cost of cleaning and drying equipment and associated plumbing, heating and cooling equipment, robotic wafer handling apparatus, computerized control equipment, apparatus for storing and disposing cleaning solutions, and the clean room space required for the apparatus. Of course, there is the cost of the cleaning solutions and the cost of heating, cooling and filtering the solutions, as well as the cost of storing and disposing of them. In view of environmental concerns and regulations, the cost of disposal of certain materials can be greater than the cost of the material being discarded.

Still the most common system for cleaning semiconductor wafers utilizes a series of tanks containing the necessary cleaning solutions, with the tanks being positioned in a "wet bench" in a clean room. A batch of semiconductor wafers is moved in sequence through the series of tanks, usually by means of computer controlled automated apparatus. A major concern with this type system is that of contamination occurring as the batch of wafers is transferred from one tank to another. Also of significance is the possible contamination introduced by the handling apparatus itself. Further, whenever wafers are moved, there is the risk of damage to the wafers due to mishandling.

Another system, rather than utilizing tanks which are open to the surrounding clean room, utilizes a full, continuous flow of cleaning solutions through a pipe-like construction. A supposed advantage of that system is that by keeping the wafers immersed in cleaning fluids throughout the process, the risk of contaminants being on the wafers is decreased. The effectiveness of this system, however, is somewhat controversial, and the apparatus is relatively expensive to purchase and to operate.

Still the most commonly used cleaning solutions are those developed by RCA many years ago employing hydrogen peroxide chemistry, particularly those referred to as "standard clean 1" or "SC-1" and "standard clean 2" or "SC-2." SC-1 typically comprises ammonium hydroxide, hydrogen peroxide and deionized water in the following ratios: 1 $NH_4OH$: 1 $H_2O_2$: 5 $H_2O$. SC-2 usually comprises 6 $H_2O$: 1 $H_2O_2$:1 Hcl. Typically wafers are immersed in these solutions for 10 minutes at 25°–80° C. for each solution. Intermediate and final rinses of deionized water are used between chemical steps. If the wafers are particularly contaminated, there is an initial cleaning step utilizing a solution known as "Caros" or "Pirhana," typically comprised of $H_2SO_4$ and $H_2O_2$ in ratios varying from 2–5:1. Following the use of Pirhana there is frequently an additional etching step employing DHF (dilute hydrofluoric acid).

While those solutions contain the most commonly used chemicals and those are the most common ratios, solutions with other ingredients and solutions with different ratios have been utilized, including some with relatively dilute solutions of the active ingredients. A modified SC-1 mixture of 0.01 $NH_4OH$: $1H_2O_2$:$5H_2O$ has been reported to help reduce surface roughening.

An additional technique for loosening particles, is that referred to as megasonic cleaning. In this technique, highly effective non-contact scrubbing action on both front and back side surfaces of the wafers is achieved by extremely high-frequency sonic energy, while the wafers are submerged in liquid. By utilizing the megasonic system, with standard cleaning solutions, films and adsorbed contaminants are removed at the same time that particles are being removed by the megasonic energy. Sonic waves of 850–900 Khz are generated by an array of piezoelectric transducers. Particles ranging in size from several micrometers down to about 0.2 micrometers have been efficiently removed with input power densities of 25 watts/in. Megasonic cleaning systems are available from VERTEQ, INC., assignee of the present invention.

As noted above, because of the advances in the miniaturization and functions of semiconductor circuit devices, improved semiconductor cleaning techniques are highly desirable. Some of the goals or industry needs are to reduce particulate levels to less than 0.1 micron, to reduce defect density levels to less than 0.001 particles/$cm^2$, and to reduce surface metallic contamination levels to $1E^8$ atoms/$cm^2$. In addition, it is desirable to eliminate chemical cross-contamination from transfer of cassettes from one tank to another, as with traditional systems. Further, an important goal is to control the cleaning processes to prevent or minimize surface microroughness of the finished product. Another goal is to reduce the high cost of ownership associated with wet chemistry processing, which includes the cost of cleaning solutions and their disposal, and many other elements. It is, of course, always desirable to lower the initial cost of equipment and to improve the reliability of the equipment.

SUMMARY OF THE INVENTION

The two priority applications referred to above contain claims directed to improved processes employing dilute chemistry, and also claims to the improved apparatus and method of use. The claims of the present application are directed to the apparatus and method of using the apparatus.

However, the processes concerning the dilute chemistries are also summarized here so as to better understand the apparatus. Briefly stated, the improved semiconductor cleaning processes disclosed herein utilize highly dilute cleaning solutions different from the commonly used SC-1 and SC-2 solutions, and megasonic energy is applied to the wafers selectively during the cleaning steps and during the rinsing steps. The cleaning and rinsing steps are preferably all performed in a single tank or without moving the wafers, utilizing a combination of continuous flow, quick dump and spray rinse techniques.

Such a process accomplishes the aforementioned objectives of improved cleanliness and reduced costs of equipment and costs of ownership. The use of highly dilute cleaning solutions not only reduces the cost of materials required, but also eliminates the need for the handling of toxic materials in that most of the highly dilute solutions can be disposed of without special handling equipment or techniques. It has also been found that the excellent cleaning results are obtained in a much shorter time than that required for the conventional process of moving a batch of wafers through a sequence of cleaning tanks. Rather than using conventional SC-1 and SC-2 chemistries using highly dilute cleaning solutions enables the effective, high purity chemicals to be injected to an incoming water flow, thereby eliminating other previously used batch mixing techniques for such materials. Further, the use of dilute solutions reduces the volume of rinsing water and the amount of time required for rinsing.

The preferred cleaning system of the invention which may be referred to as "VcS," includes several steps or cycles, some of which have optional aspects, and each of which includes the use of a preferred dilute solution. Cycle 1, which may be referred as Vc1, includes a solution comprising 300–600 $H_2O$:2 $H_2O_2$:1 $NH_4OH$ and about 14 ppm of a suitable surfactant. A second cycle, which may be referred as Vc2 employs a highly diluted buffered oxide etch (BOE). In a third cycle, which may be identified as Vc3, a solution is employed having 1000 $H_2O$:5 $H_2O_2$:1 $NH_4OH$ and 20 ppm surfactant. In a fourth optional cycle, Vc4, a solution is employed having 1,000 parts $H_2O$ to 1 part Hcl. These unique solutions are provided at certain preferred temperatures, in a particular sequence and manner, and also, megasonic energy is applied in certain stages.

In a preferred sequence of the Vc1 cycle, a tank containing the wafers to be cleaned is quickly filled with hot deionized water. In one example, the tank was filled in about a minute with hot DI water. The wafers are then inserted. As the hot water is entering, cold DI water is also introduced, at a low rate, to carry chemical and to cause tank overflow after the tank is filled. The diluted surfactant and the ammonium hydroxide are injected at the beginning of the cycle at rates that cause them to reach the desired ratios in the solution. Hydrogen peroxide is introduced into the tank after a delay period of about 25 seconds at a rate to cause that component to reach its desired strength in the final solution at the same time as the ammonia. All the chemical additives for the Vc1 solution are in the tank within about a minute and a half, such that the above-mentioned ratios are attained, except to the extent that a minor amount of the chemical is continuously lost due to the continued low flow of cold DI water into the tank and its overflow at the top.

In one form of the invention, each of the chemical is introduced through a manifold into the DI water flow entering the tank. The inflowing DI water and chemical are circulated throughout the lower portion of the tank and then rise as a uniform mixture. In a preferred form of the invention, a diffusing element is positioned below the wafers being cleaned to prevent splashing of incoming liquid and to cause the solution to rise uniformly in a laminar flow pattern within the tank so that all the wafers are treated in a similar manner.

In another form of the invention, each of the chemicals is injected directly into the tank rather than with the DI water. The injection ports are in the lower portion of a side wall of the tank adjacent the water inlet port and below the diffuser. Megasonic energy is applied to the interior of the tank after an initial delay of about 15 seconds, but prior to the insertion of the wafers.

One of the significant advantages of the invention is that it has been found that the wafers only need to be subjected to the cleaning solutions for a short period of time, even though they are very dilute. Thus, after the chemicals have been added in about the first 90 seconds, it is only necessary to continue the flow of cold DI water and the application of megasonic energy for about an additional 90 seconds. This creates a total cleaning cycle time of about 3 minutes.

The tank is then quickly emptied and cool DI water is sprayed onto the wafers and the interior sides of the tank. Simultaneously, the megasonic energy power level is reduced. The tank is then refilled with cold DI water at a high flow rate, while the cold spray continues. Once the level of liquid in the tank covers a megasonic energy transducer array in the lower part of the tank, the megasonic energy is once more applied at full power until the cold DI flow is terminated and the tank is once more dumped. The cold DI spray is interrupted near the end of the cold DI flow, but then is continued when the dump valve is opened. These steps of dumping and rinsing are repeated as needed.

If a diluted hydrofluoric acid (DHF) treatment of the Vc2 cycle is employed, HF in the form of diluted buffered oxide etchant (BOE) is applied to the wafers. This may be accomplished by dumping the tank contents, raising the cassette of wafers, filling the tank and then immersing the wafers in the tank. To prevent streaking, the wafers should be quickly immersed in the HF bath. This solution acts to strip the oxide, removing metals which are less electronegative than silicon. The megasonic energy is not applied during this period of time in that it has been found that the dilute buffered hydrofluoric acid treatment is better without megasonic treatment. Utilizing the megasonic treatment when the wafer surface is hydrophobic tends to cause microroughening of the surface. The wafers are only treated for about a minute before the solution is quickly dumped to a discharge tank or recycling unit.

The above method of controlling HF is one of three techniques disclosed. A second method of utilizing diluted HF is to remove the wafers from the overflowing and megasonically active DI wafer tank and move them to a free-standing recirculated and filtered diluted hydrofluoric acid (DHF) tank for the time required to remove the oxide. At the end of the time period the wafers are quickly transferred back to an overflowing DI water bath without megasonic energy. This technique is best suited for more concentrated HF solutions where greater than 100 A° of oxide is required to be removed from the surface.

Another technique which is preferred for HF-last applications or applications in which only native oxides of 20–30 angstroms (A°) need to be removed is to inject small amounts of HF or BOE into the cold DI water stream to create the desired concentration of HF. At the end of the etch period (approximately 2 minutes), the HF injector is turned off and high flow DI water rinse is begun, removing the chemistry from the wafers without exposing them to an air interface. This reduces the particulate contamination associated with this interface.

A combination of the latter two techniques is also possible when moderate to large amounts of oxide (>300 A°) need to be removed and it is desired to terminate the DHF sequence with the injection techniques to reduce contamination levels for HF-last requirements. This approach would be accomplished by starting the etch in the separate recirculated and filtered HF tank for a sufficient time to remove all but the last 50–75 A° of oxide. The wafers would then be quickly transferred to the overflowing DHF mixture already prepared prior to the transfer. The remaining oxide would then be removed at a much lower rate. The process is terminated by stopping injection of HF. High flow DI water then replaces the chemistry in situ. The overflowing chemistry and DI water are collected in the overflow weir and directed to a dedicated HF waste treatment drain. Once the dilution is adequate, the diverter valve can be switched to the normal plenum drain.

Rinse DI water is applied to the tank and allowed to overflow for about 5 minutes, without spray or dump. In some situations, the quick dump procedure is followed to rinse the wafers more quickly. The wafers are then dried for HF last application. Or if the Vc3 cycle is desired, surfactant is injected into the cold DI line; and after 15–30 seconds, a small amount of hydrogen peroxide is injected into the cold DI stream. During this phase, cold DI is flowing continuously through the tank at high rate, causing overflow. The flow of cold DI water, the $H_2O_2$, and the surfactant is then stopped for about 1 minute.

Hot water flow then starts with surfactant, followed by the introduction of hydrogen peroxide through the cold DI line. Ammonium hydroxide is introduced once the bath temperature reaches 40–45° C. and is continued for about 15 seconds. The flow of hydrogen peroxide and surfactant continues for about a minute and is stopped about when the $NH_4OH$ stops, while the LOW-FLOW COLD DI water continues.

In a final cleaning step of the Vc3 cycle, hot DI water at a high flow rate is once more injected into the tank, causing a high rate of overflow at the same time that surfactant is introduced into the cold DI line. After a short delay, additional ammonium hydroxide and hydrogen peroxide are introduced for about a minute. Once the temperature reaches 50–55° C., the megasonic energy is once more applied. After the introduction of the hot DI and the chemicals, only cold flow DI continues for a short period, while the application of megasonic energy continues. The tank is then subjected to a series of dump-and-rinse cycles, with the megasonic energy applied when the transducer area is covered with liquid.

If the Vc4 cycle is desired, hot DI water is introduced to displace cold DI water in the tank. After the hot water has been flowing for a short period, a small amount of Hcl is injected into the cold DI flow line. The megasonic energy is applied throughout this period of time. The tank is then subjected to a final series of dump and rinse cycles. The wafers are then ready to be dried.

The above-described process provides surprisingly good results compared to conventional "wet bench," multiple tank techniques. The particle removal capability of the diluted chemical components is remarkable, as is the minimization of undesirable metals and surface microroughness. Prior systems which were thought to be adequate were usually not even tested for the presence of particles below 0.3 microns. This process is capable of removing particles below 0.11 $\mu$.

In addition, the overall time required for the entire operation is much less than that required by conventional techniques. Also, less chemicals and less water are employed, resulting in reduced costs. In addition, the equipment is less expensive and the space required is reduced.

Another major advantage of the present invention is that the chemicals are used in such dilute quantities that they can, except for the HF, simply be sent to drain along with the DI water. The amount of chemical in the water may be less than that which is flushed to drain when cleaning a tank having had a more concentrated chemical component. Less chemical means less contaminants, particularly since the chemicals are the major cause of undesirable metals. Another advantage of the system is that all cleaning steps can be performed in a single tank.

Although possibly unnecessary, current environmental considerations require that even very dilute HF be stored for special handling for disposal or else to be recycled. Thus, when the liquids used during the Vc2 cycle are drained from the cleaning tank, they are transferred to a special tank rather than down a regular drain. One preferred alternative is to provide one or more reservoirs that enable the Vc2 liquid to be used again within the same tank. This can be done with a lower reservoir and an upper reservoir arranged so that the process tank can be quickly dumped and refilled, employing large valves in the side walls of the process tank.

BRIEF DESCRIPTION OF THE DRAWINGS

FIG. 1 is a schematic end view of a system utilizing the invention, including a cross-sectional view of a cleaning tank with a cassette of wafers positioned therein.

FIG. 2 is a schematic side elevational view of the tank of FIG. 1.

FIG. 5 is a chart showing the composition of the cleaning solutions used.

FIG. 11 is a side elevation schematic view of an alternate arrangement for introducing the chemicals into the tank.

FIG. 12 is a cross-sectional view of the arrangement of FIG. 11.

DETAILED DESCRIPTION OF THE INVENTION

Figure 3:
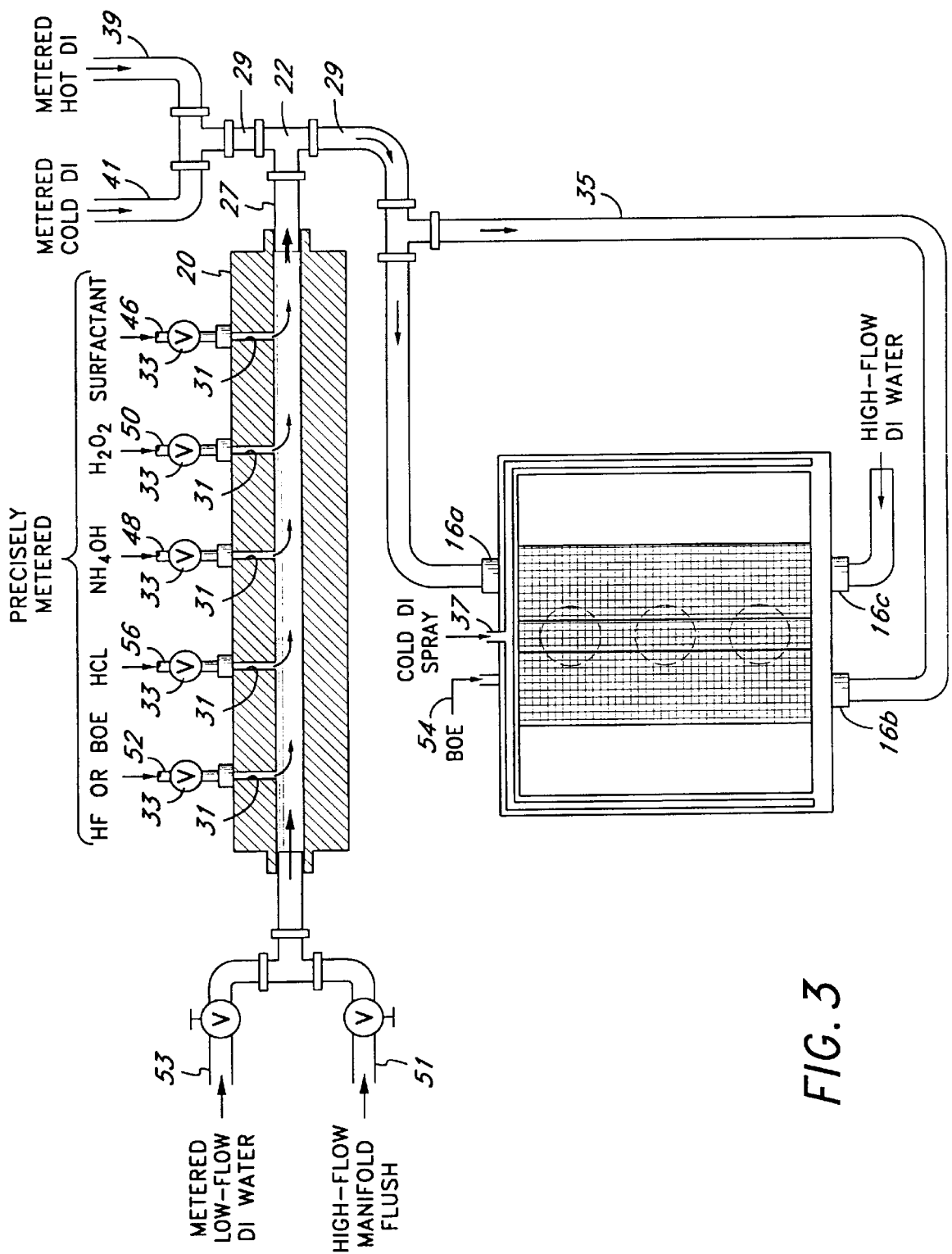
FIG. 3 is a schematic plan view of the tank of FIG. 1 with the liquid flow lines.

Referring to FIGS. 1 and 2, there is illustrated a process tank 10 having spaced vertical end walls and side walls, with the side walls having spaced upper portions that taper to more closely spaced lower portions. On the exterior upper edge of the tank 10 is a lip 13 having a generally triangular cross section. The lip has an upper side which tapers outwardly and downwardly preferably at about a 15° angle with respect to horizontal and a lower wall which slopes downwardly and inwardly at about a 75° angle with respect to horizontal. Such an arrangement promotes skimming across the liquid surface causing the surface liquid to be "pulled" down the exterior walls of the tank. Optionally, an overflow weir 17 may be employed to collect the overflow and direct it to a desired drain 23. This is important during the direct injection method for the diluted HF or BOE overflow. Alternatively, the entire tank may be positioned in a compartment having a suitable drain in its lower wall.

The tank is preferably sized to handle batches of 25 or 50 wafers 14 shown supported therein, or to receive a cassette supporting the wafers. The wafers are preferably positioned with their large flat sides vertically oriented and spaced in generally parallel aligned relation. As may be seen, the tank is sized to roughly conform to the shape of a group of wafers so as to minimize the quantity of liquid required.

A pair of inlet conduits 16 is illustrated near the lower portion of the tank for introducing cleaning and rinsing solutions from opposite ends of the tanks. The inlets are oriented to produce a circular flow of the inlet liquids to facilitate mixing. A large diameter dump valve 18 is shown in the tank bottom on opposite ends of the tank. Each valve outlet is closed by a valve member mounted on a pneumatic piston 21 for quickly retracting the valve member to dump the contents of the tank quickly. A third dump valve 19 is shown in the central portion of the tank for dumping DHF since such material cannot be dumped directly through the regular valves 18.

Referring to FIG. 3, a manifold 20 is schematically illustrated connected to a small diameter conduit 27 for ducting cold deionized water into the tank at a low metered rate. This conduit feeds into a larger conduit 29 through an adductor venturi 22 connected to suitable sources of metered hot or cold DI water and the tank inlet 16a. A plurality of manifold inlets 31 are schematically shown connected to the manifold central passage for injecting precisely metered amounts of chemicals or rinse water into the conduit 27. The manifold inlets 31 are shown greatly enlarged in FIG. 3 merely for visibility, but the passages are actually very small relative to the conduit 27. Suitable commercially available injector valves, schematically illustrated at 33, may be utilized for opening and closing the injectors at the desired times. Preferably, the valves are pneumatically controlled. The inlet to the manifold 20 is connected to a high flow manifold flush conduit 51 and a precisely metered low flow conduit 53. A conduit 35 is utilized so that hot or cold mixed chemicals or pure DI during rinsing can be directed into the tank from opposite ends of the tank. A separate cold water line may be connected to inlet 16c to create a rapid fill during rinsing. A spray inlet 37 in one end of the tank is also connected to a source of DI water.

A megasonic energy generator or transducer assembly 24 is shown schematically extending across the tank above the outlets 18 and below the wafers 14. The preferred assembly includes a tube 26 extending across the tank with its ends extending through the tank end walls with suitable sealing. One or more piezoelectric transducers 28 having thin arcuate shapes are coupled by a suitable bonding epoxy or other suitable means to the interior upper wall of the tube. One suitable bonding material is an epoxy sold in sheet form by Ablestick of Gardena, Calif., and identified as ECF 550. Electrical connections 30 extend through the ends of the tube exterior of the tank. Very high frequency energy in the range of 800–900 Khz and above is applied to the transducers causing them to vibrate, which in turn transmits such vibration into the cleaning solution.

In a preferred arrangement, the tube is formed of aluminum and is provided with a Teflon sheath or layer on its exterior so that the assembly can be used with cleaning solutions that would otherwise attack aluminum. Because of the highly dilute chemistries utilized by this invention, the use of a Teflon sheath covering the aluminum is very satisfactory. Stronger concentrations, typical of SC-1 and SC-2 could be a problem due to the penetration potential into Teflon of these chemicals, especially Hcl. Making the tube of quartz is also a good alternative. Quartz is not as strong as aluminum, and it may require the protective Teflon layer for some uses. Other materials are currently being evaluated to replace the aluminum and the sheath.

An elongated partition 34 divides the tube interior into an upper chamber and a lower chamber, as best seen in FIG. 1. Cooling water is ducted through the lower chamber by an inlet 36 and an outlet 38 to maintain the temperature of the transducer within an acceptable limit. An inlet 40 and an outlet 42 are provided for the upper chamber for the ducting of nitrogen or other inert gas to prevent other gas from entering the tank. A sensor 25 senses the liquid level in the tank and will de-energize the assembly, or cause it to switch to a low power setting, when the level is below that. This keeps the transducers at a satisfactory temperature. The assembly 24 is the subject of U.S. patent application Ser. No. 042,889, filed Apr. 5, 1993, now U.S. Pat. No. 5,365,960, issued Nov. 22, 1994, which is incorporated herein by reference.

Operation

Vc1 Cycle

In operation of the VcS system, one or more wafers 14 are positioned in the tank 10. In a preferred form of the invention, the wafers are first subjected to the cleaning steps of the Vc1 cycle, as illustrated in the timing diagram in FIG. 4. As may be seen, the time in minutes is shown on the top line of the diagram, and the various liquid flows and process steps are set forth on the left side of the diagram. The time lines for these items are raised when "on" and down when "off."

Figure 4:
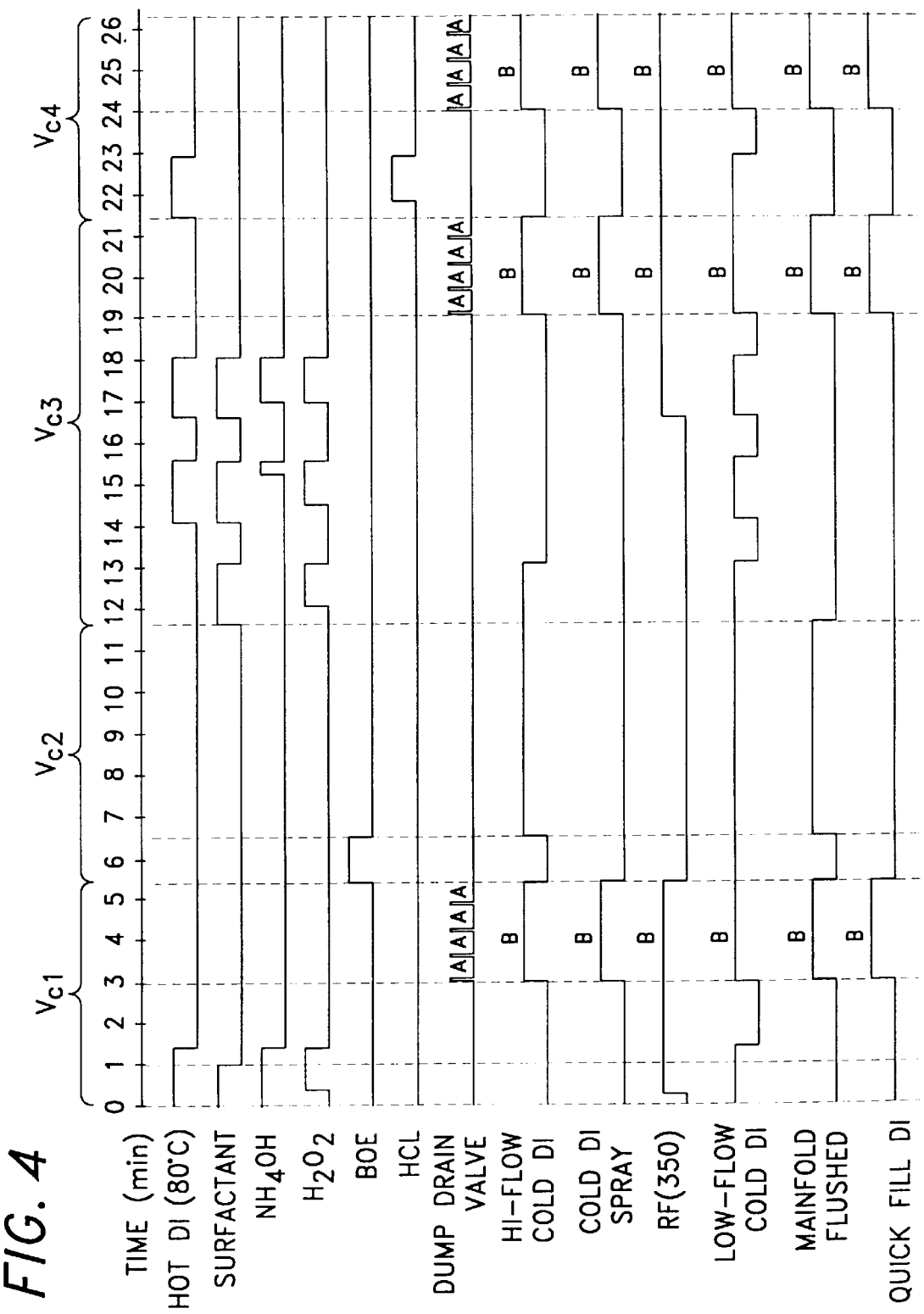
FIG. 4 is a timing and flow diagram schematically illustrating the steps of the Vc1 through Vc4 cycles.

Hot deionized water is introduced to the tank 10 by way of conduit 29 and inlets 16a and b, as shown on the hot DI line in FIG. 4. In one form of the invention, the water was introduced at a rate of a little over 16 liters per minute at 80° C. During the first 10 seconds, the dump valves 18 are left open as the water is being brought up to temperature and the conduits are being flushed. In a prototype form of the invention, a tank having a liquid capacity of approximately 16 liters was employed, with the result that the tank was filled in about a minute after the dump valves were closed. The water then flows over the top of the tank, and the water is shut off in a little less than a minute and a half.

At the same time that the precisely metered hot DI water is being introduced through conduit 39, a precisely metered low flow cold DI trickle is also introduced through the conduit 53, the manifold 20, and conduit 27 to the conduit 29. The flow rate of the cold DI water is very small, only about 379 cc per minute in a prototype system, with a temperature of about 30° C.

A suitable surfactant diluted with DI water at about 100:1 is introduced through the conduit 46 and into the manifold 20, at a very small rate, such as about 32 cubic centimeters per minute to provide an ultra dilute concentration in the tank. While various surfactants may be employed, a preferred one found to be of high purity is that sold under the trade name WAKO, NCW-601A, sold by Wako Chemicals. As shown in FIG. 4, the surfactant is introduced at the beginning of the cycle and continues for about one minute. The surfactant protects the wafer to some extent from the $NH_4OH$ and also reduces surface tension of the DI water.

Ultra high purity, parts-per-billion (ppb) grade $NH_4OH$ is also introduced at the beginning of the cycle through line 48 at a slow rate of about 53 cubic centimeters per minute, in a particular system. The surfactant and ammonium hydroxide are introduced to the cool deionized water flow in the manifold because the manifold valves 33 are more reliable at the temperature of unheated deionized water. Also, if the injected chemicals are in gaseous form, better mixing is obtained.

After the ammonium hydroxide and surfactant have been flowing for about 25 seconds, ultra high purity, ppb grade hydrogen peroxide is injected through the conduit 50 into the manifold. Although the $H_2O_2$ is usually injected first to grow an oxide to minimize interface surface roughness that is caused by the $NH_4OH$, it has been found that microparticle loosening is enhanced by allowing the ammonium hydroxide, surfactant mixture to perform initial cleaning before the hydrogen peroxide is injected. The hydrogen peroxide is introduced at a rate double that of $NH_4OH$, or of approximately 106 cubic centimeters per minute. This occurs for only about one minute, with the $NH_4OH$ flow terminating at that time also.

The flow rates employed are intended to provide a mix ratio in the process tank of approximately $300H_2O:2H_2O_2:1NH_4OH$ with only about 10 to about 20 parts per million surfactant. This is the approximate concentration after the cycle has been underway for about 85 seconds. The hot deionized water and the $H_2O_2$ and $NH_4OH$ components are all stopped at that point, the surfactant introduction having already stopped. Prior uses of surfactant in the cleaning of wafers have indicated that 100 parts per million was the minimum amount. In instances of minimum particulates on the wafers, even less surfactant may be sufficient. Also, more surfactant could be used and may be desired, for particularly "dirty" wafers. However, the range mentioned above is preferred for most situations. Too much surfactant can require longer rinse time.

Although the final mix ratio of the chemicals and the deionized water is as expressed above, it should be recognized that the introduction of chemicals and the mixing of them with deionized water is somewhat of a dynamic situation. The $NH_4OH$ was introduced before the $H_2O_2$, but the initial portions of the $NH_4OH$ and the DI water flow out of the top of the tank before the flow is stopped. The rate of flow for the two chemicals is the same as that in the final relationship. As chemical is introduced into the bottom of the tank, the lower portions of the wafers are subjected to the DI water mixed with chemical before the upper portions, even though the mixing within the tank is effective. As the time elapses, perhaps the lower portions of the wafers are subjected to a slightly more dilute solution than the upper portions. On balance, however, the final mix ratio is believed to be fairly uniform for about 90 seconds after the chemical injection has ceased.

As may also be seen from the RF line in the timing diagram, the megasonic energy is applied to the tank contents after about 20 seconds from the start, the water level having submerged the transducer assembly. The megasonic energy greatly enhances the effectiveness of the cleaning operation and synergistically enables the outstanding results to be obtained with such dilute solutions. This is in contrast to the much longer times required for conventional wet processing utilizing more concentrated solutions and not employing megasonic energy on the wafers.

While the dilution ratio of 300 DI $H_2O$ to $1NH_4OH$ and $2H_2O_2$ is preferred for the greatest cleaning power, increasing the dilution to 600 parts $H_2O$ has been successfully used on easier to clean contaminants. The actual concentration is determined by the contamination on the "feed" wafer.

The chemistry used in the Vc1 cycle replaces the use of hot sulfuric acid and hydrogen peroxide, commonly referred to as "Piranha," and acts to remove light to medium organic residues and particulates prior to a step employing hydrofluoric acid. The Piranha treatment may still be needed initially for the stripping of wafers having heavy organic deposits such as photoresist.

As mentioned above, in situations in which the tank is not filled with deionized water and a solution is being introduced to the tank, undesirable splashing can occur under the wafers, or out of the tank onto an operator. Thus, the diffuser or straightening device 43 is shown positioned above the inlet 16 to prevent the splashing and to direct the incoming solution generally vertically upwardly in the tank. Also, in cases in which the tank is initially filled with water, the vanes of the diffuser help uniform displacement of the untreated water.

Allowing liquid to overflow the upper end of the tank carries contaminants loosened from the wafers out of the tank. The angled lip 13 on the tank provides an outward component to the flow which has been found to improve the overflow action.

As may be seen from the timing diagram, the cleaning of the Vc1 cycle is complete after 3 minutes. The remaining 2.5 minutes of the cycle are utilized for a series of rinsing steps, which include quickly dumping the contents of the tank, quickly refilling the tank, as shown by the HI-FLOW COLD DI line and the Quick fill D1 line in FIG. 4, while spraying the wafers and the tank walls through nozzles 19. The spraying and the high flow DI continue throughout the rinse phase, as shown. All of the chemicals except HF can be directed into a conventional drain inasmuch as the solutions are so diluted.

Megasonic energy is applied to the liquid during rinsing as soon as the transducer assembly 24 is covered. The rinse water is allowed to overflow the top of the tank for about three seconds and then the liquid is dumped to drain. That rinsing step is then repeated as necessary for a particular operation. Four rinse and dump cycles are shown on the timing diagram and have been found necessary in initial testing employing a cassette holding the wafers. In some situations such as with no cassette, as shown in FIG. 1, fewer quick dump and rinse cycles may be satisfactory. Also, a smaller tank may be utilized without a cassette, and that, in turn, would slightly reduce the cycle times.

The rinse sequence is very fast (20 seconds for each fill) inasmuch as the high flow cold DI water, a quick fill of fine manifold flush, and the spray are functioning. Thus, DI water is flowing at a rate of approximately 48 liters per minute, and a 16-liter tank is quickly filled to a level to cover the wafers in approximately 20 seconds. The actual time is dependent on water pressure which varies considerably. Much less water is used than that in conventional rinsing, since only 3–5 seconds of overflow is used as compared to other systems, wherein water flows through the system for a much longer period of time. Deionized water is sprayed on the wafers by means of spray nozzles to prevent contaminants from settling on the wafer while deionized water is being introduced from below. The spray preferably provides relatively large droplets as opposed to mist. This is important to reduce the potential of electrostatic discharge associated with high resistivity (18.2 megohm cm$^{-1}$) DI water spray systems.

During rinsing, the manifold 20 is flushed with cold DI water to eliminate traces of the chemical that were added. This is injected through line 51 of FIG. 3 and is shown on the "Manifold Flushed" line of FIG. 4.

Vc2 Cycle

At the completion of the Vc1 cycle, it is usually desirable to subject the wafers to DHF in the Vc2 cycle. Because under current environmental controls a DHF solution cannot be simply dumped directly to a conventional drain, it is most practical to filter, store and reuse the solution. This is especially true for more concentrated DHF mixtures such as 30:1 or 50:1. The wafers may be subjected to the solutions in several different ways. The wafers may be transferred from the tank 10 to an adjacent tank (not shown) containing the desired DHF solution, and then returned to the tank 10 for rinsing. This is necessary if >100 A° of oxide are to be removed. More concentrate DHF may be required to reduce the etch time.

However, preferably the wafers are treated in the same process tank 10. It is also desirable that the solution be applied quickly to the wafers to prevent streaking or lining. Thus, in a second approach, the wafers may be lifted from the tank 10 as the tank is filling and then quickly lowered into the tank solution. In a third approach, discussed below in connection with FIG. 6, the solution is quickly added to and drained from the tank without moving the wafers.

All deionized water low flow is interrupted for at the commencement of the Vc2 cycle, so as not to change the concentration of the solution to be added. Megasonic energy is not applied during the Vc2 cycle, as noted in the RF line of FIG. 4.

Assume that the wafers are lifted above the tank 10, the DHF solution is quickly introduced to the tank through conduit 54. The solution comprises 100 parts DI $H_2O$ to one part of buffered oxide etchant (BOE). The etchant, however, is purchased in liquid form having a composition of over 50% water to 1HF:5NH$_4$F, and a surfactant buffering agent. The final mix in the tank is thus, in effect, 1HF:5NH$_4$F:200+ DI $H_2O$. A suitable etchant is sold by Ashland Electronic Chemical Division at Columbus, Ohio under the trade name ULTRA ETCH. The etchant has an assay range of 33.6–34.6% for the NH$_4$F and a range of 7.13–7.23% for the HF.

The Vc2 cycle solution acts to strip the oxide from the wafers, removing metals which are less electro-negative than silicon. The BOE material creates very little surface roughening.

In a prototype system it takes about 30 seconds to fill the tank with the Vc2 cycle solution and about 30 seconds to drain the solution. The wafers are raised when the tank is draining, and should be transferred to a DI $H_2O$ holding tank with such slow filling, to prevent drying. The BOE time line in FIG. 4 shows the BOE "on" for about one minute, without showing the filling and draining time, since only a few seconds are required to transfer the wafers to a different tank. Also, the main tank can be filled and emptied quickly as discussed below. The solution is transferred to a separate tank to be filtered, stored and reused.

As mentioned above in the Summary of the Invention, another technique which is preferred, if the HF step will be the last or if only native oxides 20–30 A° need to be removed, is to inject small amounts of HF or BOE through the manifold conduit 52 into the cold DI flow from conduit 53 into the manifold 20 to create the desired concentration of HF. At the end of the etch period (approximately 2 minutes), the HF injector is turned off and high flow DI water rinse is begun, removing the chemistry from the wafers without exposing them to an air interface. This reduces the particulate contamination associated with this interface. The combined technique mentioned above may also be used.

Assuming the Vc3 cycle is to follow, the wafers in the tank can be treated by a series of quick dump and refill cycles without spray. The rinse water can flow directly to a conventional drain. Spray-rinsing is commenced as the cleaning solution drains. The tank is filled with cooled DI water, when the cycle ends.

If the wafer cleaning is to end with the HF treatment, the wafers are rinsed with DI $H_2O$ for about 5 minutes, as shown in FIG. 4, the water being allowed to overflow. The wafers are subjected to a drying procedure as soon as the wafers are removed. The reason for not using the dump and spray rinse procedure is that dumping and spraying cause contamination on the wafers. This is not as much a problem if the Vc3 cycle is employed in that it removes such contamination; however, even in this sequence, the overflow is utilized to minimize contamination and possible damage to the wafer by exposing it to air water interfaces.

In order to improve the particulate levels of the HF rinse sequence in either scenario above, point-of-use filtered DI water is employed. The filter of choice is made by Pall Corp., and identified as a "Posidyne N-66" filter, with an absolute pore size of 0.045 micron. The Posidyne line of filters has a positive "Zeta potential" which has a strong attraction for colloidal silica in the DI water stream. If the filter is not used, the colloidal silica particles are attracted to the positive surface of the silicon wafer directly after the HF treatment in which all of the native oxide is removed. All of the DI water used in obtaining the VcS system results disclosed herein was filtered in this manner.

Vc3 Cycle

A third cleaning solution is then created for the Vc3 cycle which is similar to the solution used in the Vc1 cycle, but is even more dilute, as well as being delivered in a unique manner. As a first step of the Vc3 cycle, a dilute surfactant, such as the WAKO product discussed above, is introduced in the cold DI $H_2O$ LOW-FLOW conduit 27 at a rate of about 32 cubic centimeters per minute for about 80 seconds, as shown in FIG. 4, creating a very dilute surfactant solution. At the same time, the controlled flow cold DI water is flowing into the tank through the conduit 41, causing it to overflow. The surfactant reduces the surface tension of the wafer and coats the surface with a thin organic film prior to the introduction of the chemicals. This acts to reduce the chemical attack of the delicate, extremely reactive surface immediately after the dilute HF treatment.

About 20 seconds after the surfactant flow is initiated, ultra high purity, ppb grade hydrogen peroxide is added through the injector 50 into the manifold 20 at a rate of about 106 cubic centimeters per minute for about 1 minute to begin the slow regrowth of native oxide on the surface, together with the low flow cold DI water through the manifold. The addition of the $H_2O_2$ ends at the same time as the surfactant. These rates create a dynamic mixture of about 400 $H_2O$ 2 $H_2O_2$ and about 20 parts per million surfactant, considering that cold DI water is flowing into the tank as the chemicals are being added, both at the high flow rate through conduit 29 and at the low flow rate through conduit 27. Although the chemical is very dilute, dilution ratios up to 800 parts $H_2O$ have proven effective. After the $H_2O_2$ is introduced, the controlled flow DI water injection through conduit 41 is interrupted, leaving only the LOW-FLOW DI through conduit 27 to assist in the overflow of contaminants. This step is continued for about 1 minute, as can be seen from the timing diagram. The solution temperature during this step remains at about 30° C. The purpose for this first step of the cycle is to slowly grow native oxide on the wafers in such a manner as to minimize surface microroughness, with no megasonic energy applied.

As seen from the timing diagram, at about 2½ minutes from the start of the Vc3 cycle, controlled flow hot DI water begins to be flowed through the tank from the conduit 39 for about 1½ minutes. Simultaneously, surfactant is introduced at about the 32 cc/min. flow rate for that same time period. After about 25 seconds, hydrogen peroxide is injected into the cold DI stream in the manifold at the rate of about 106 cc/min. The $NH_4OH$ flow begins about 45 seconds after the $H_2O_2$ and continues for about 15 seconds at the rate of about 53 cc/min. As may be seen from the timing diagram, the controlled flow hot DI water flow, the surfactant flow $NH_4OH$, and the $H_2O_2$ flow stop at the same time. The solution temperature during this step has increased from about 30° C. to 45° C. The wafers are therefore subject to this warm bath with the highly diluted chemical ratios expressed. The purpose for this step is to further build up the oxide by increasing the liquid temperature, followed by the injection of minute amounts of $NH_4OH$ to remove particulates. This procedure is important to prevent increasing surface roughening.

At the completion of that two-minute step a third injection step occurs, which is the same as that of step 2 of the Vc3 cycle, except that the $NH_4OH$ flow continues longer. That is, controlled hot DI water is flowed through the tank along with injection of surfactant, and after about 25 seconds, $NH_4OH$ and $H_2O_2$ are injected into the tank for about 1 minute, at about the 53 and 106 cc/min. rate respectively. After that injection, the hot DI water and the surfactant are also interrupted and the tank is left with only the low flow cold DI water for a period of about 1 minute. The temperature of the bath has increased to about 60°.

As a very significant addition in the third step of the Vc3 cycle, the megasonic energy is once more applied to the tank at the time when the bath temperature reaches 50–55° C., assuming the adequate growth of native oxide. The megasonic energy was not applied during the first two steps of the Vc3 cycle, so as not to interfere with the formation of oxide on the wafers, which is very critical to minimize surface microroughening.

After this 1 minute treatment, the tank is subjected to the quick dump, spray and refill cycles, including flow through the manifold. Megasonic energy is also applied when the tank is sufficiently filled, as with the dump and rinse cycles of Vc1.

The purpose of the Vc3 cycle is to grow a chemically pure, metal-free native oxide on the wafers without increasing the surface microroughness, as well as to remove particles attached to the surface during the DHF sequence of the Vc2 cycle. The unique sequence of the Vc3 cycle is designed to achieve the lowest surface microroughness possible utilizing a high Ph cleaning chemistry which is very conducive to removing particles. It also controls the deposition of metallic species typical of high Ph peroxide solutions by controlling the purity of the chemicals used. This is done by the extreme dilutions of the already ultra pure ppb grade chemicals, as well as by the short exposure time of such chemicals.

Vc4 Cycle

At the completion of the Vc3 cycle, the rinsed wafers remain in cool DI water, with the low flow cool DI water continuing and with the megasonic energy being applied to the tank. At the commencement of the Vc4 cycle, hot DI water is added for a period of time, about 90 seconds. After the temperature of the tank has increased for about 20 seconds, Hcl is introduced through interjector line 56 for about one minute. This results in a final mix ratio of about 1,000 $H_2O$ to 1 Hcl. After the hot DI flow and the Hcl flow are interrupted, the wafers continue to be subjected to this highly dilute Hcl treatment, as the low flow cold DI and the megasonic energy continues for about one minute. The solution temperature created by the hot DI water flow is preferably about 45° C. to obtain maximum particle removal efficiency. The purpose for the cleaning of the Vc4 cycle is to remove additional traces of metallic species.

As seen from FIG. 5, a final series of quick dump, spray, and refill cycles are then initiated with the megasonic energy applied whenever the transducer is sufficiently immersed. The Vc4 cycle is then complete, as is the cleaning of the wafers. It is then normally necessary to dry the wafers. This can be done in a variety of known ways, either in the same tank or by being moved to an adjacent tank.

If the wafers are to be dried in the same tank, the rinse liquid is drained from the tank in a manner consistent with the drying technique. If the wafers are to be removed to another device for drying, the tank should be left full with rinse water overflowing, preferably with the megasonic energy "on." This ensures that the wafers are not contaminated while waiting for drying.

As may be seen from the timing diagram of FIG. 4, the Vc1 cycle required about 5½ minutes, the Vc2 cycle about 6 minutes, the Vc3 cycle a little more than 9½ minutes, and the final cycle being a little less than 4½, for a total time of about 26 minutes. Further, as noted above, the Vc4 step may not be needed in many instances, and hence only about 21 minutes are needed. By contrast, the conventional wet bench technique employing a separate tank for each step takes about 90 minutes to process a single batch of wafers. With conventional techniques, additional batches of wafers may be started through the early stages of a multiple tank cleaning operation to clean about 300 wafers per hour, utilizing nine different tanks and a series of batches of wafers. The process of the present invention can provide comparable results with fewer tanks. Further, less megasonic apparatus and less handling equipment is needed.

In addition to the savings concerning time and the number of tanks, there are significant savings in the volume of deionized water utilized and the volume of concentrated chemicals. For example, a two-minute rinse and quick dump step is contrasted with a typical 10–20 minute rinse step for conventional techniques to achieve equivalent rinse quality. The reduction in time is due to the use of dilute chemicals which require less time for the removal of chemicals from the wafers and tank walls, and the selected use of megasonic energy during cleaning and while rinsing to prevent particles from reattaching to the walls and wafers. The megasonic energy also moves rinse water through the molecular boundary layer at the surface of the wafer, cassette, and tank walls, which is extremely difficult, if not impossible, to achieve in methods not employing sonic activated methods. For this reason, increased efficiency in rinsing occurs, as can be seen in Diagram 7. In addition to the cost of deionized water, there is an increased cost for the energy required to cool it or heat it. Thus, by reducing the quantities of heated or cooled water, the energy saving steps are in addition to the water saving.

Figure 7:
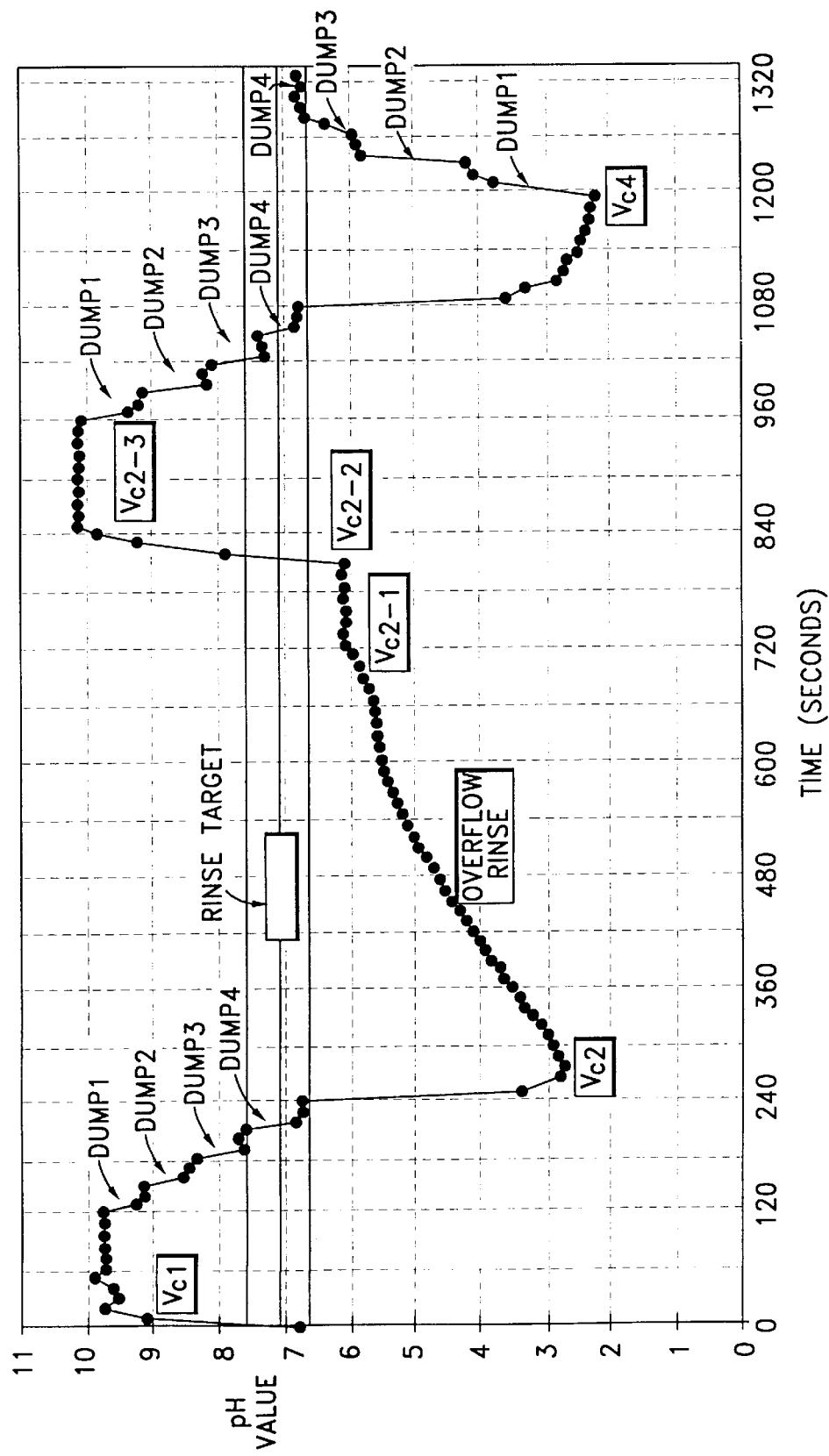
FIG. 7 is a graph illustrating the effectiveness of the rinse and quick-dump technique used in the VcS process.

The effectiveness of the rinse and quick dump technique as used in the VcS cleaning process may be better appreciated with reference to FIG. 7. The deionized water has a Ph level of slightly less than 7. The addition of the process chemicals to the DI water changes the Ph level. Rinsing the chemicals from the wafers and the tank walls moves the Ph level back towards that of deionized water. Hence, graphing the pH level of the cleaning liquid provides a convenient technique for monitoring the effectiveness of the rinsing process. The diagram of FIG. 7 shows the pH value of the liquid during the VcS cleaning process, and the elapsed time during the process is shown on the horizontal axis. Also, the various cycles of the process and the rinse dumps are indicated on the graph.

As seen for the Vc1 cycle, the pH level rises sharply to almost the 10 level as the chemicals are added. After the first rinse and dump step, the pH level has been reduced to almost the 9 level. After the second rinse and dump step, the pH level has dropped to about 8.5, and after the third rinse and dump step, the level has dropped to about 7.6. The wafers are almost adequately rinsed at that point, but a fourth rinse and dump step is desired. As can be seen from the graph, this final step drops the pH level below the rinse target and attains that of deionized water, thus indicating that the wafers and the tank are thoroughly rinsed. This outstanding performance was obtained in only two minutes. As noted above, overflow rinsing for systems employing conventional concentrated chemicals would require 10 to 20 minutes to obtain comparable quality, even those using megasonic energy.

As further seen from the graph, the effectiveness of the rinse and dump steps after the Vc3 cycle is even more dramatic in that the pH level is almost at the rinse target after a third rinse and dump step.

The dilute HCl of the Vc4 step lowers the pH value to about 2.4, as may be seen from the graph. The pH level is raised to the target level after three rinse and dump steps in the two minute rinse procedure.

As noted above, the rinse and dump step is not utilized after the pH level has been lowered by the HF of the Vc2 cycle. Instead, the overflow technique is utilized. As can be seen from the graph, the pH level after 5 minutes has been raised considerably but it is still not quite to the target range even though the chemical in the solution is very dilute. Note that BOE acid has a neutral pH. Hence, the graph is illustrating a dilute HF mixture.

It may be useful to consider some of the other differences between the standard wet bench technique and the present invention in order to appreciate and better understand some of its advantages. While the Piranha solution is useful for removing significant quantities of organic material, it leaves particles on wafers and is difficult to rinse. Rinse time of 15–20 minutes with hot DI water is typical in the industry with conventional systems. The solution of the Vc1 cycle is not only effective to remove light organic materials, but due to the dilute quantities of chemicals and surfactant utilized, and due to the use of megasonic energy in both the clean and rinse steps, the resulting wafers have fewer remaining contaminants and much faster rinse rates. A conventional HF acid cleaning step removes oxides and metals, but adds significant particle levels, as well as possible surface microroughening. The use of the cleaning solution of Vc2 accomplishes similar results but with less HF and reduced surface microroughening. Typically, SC-1 is utilized after the HF step. It is effective in removing particles above 0.2 microns, however, below that, the effectiveness drops significantly. Also SC-1 tends to add trace metallic contaminants and significant surface roughness. The use of the cleaning solution of Vc3, however, efficiently reduces particles down to 0.1 micron, does not add metals, nor cause significant microroughness. The SC2 solution removes metals, but it tends to add particles. The solution of Vc4 is probably not even needed in many instances, but it will remove trace metals and actually removes, rather than adds, particles.

Figure 8:
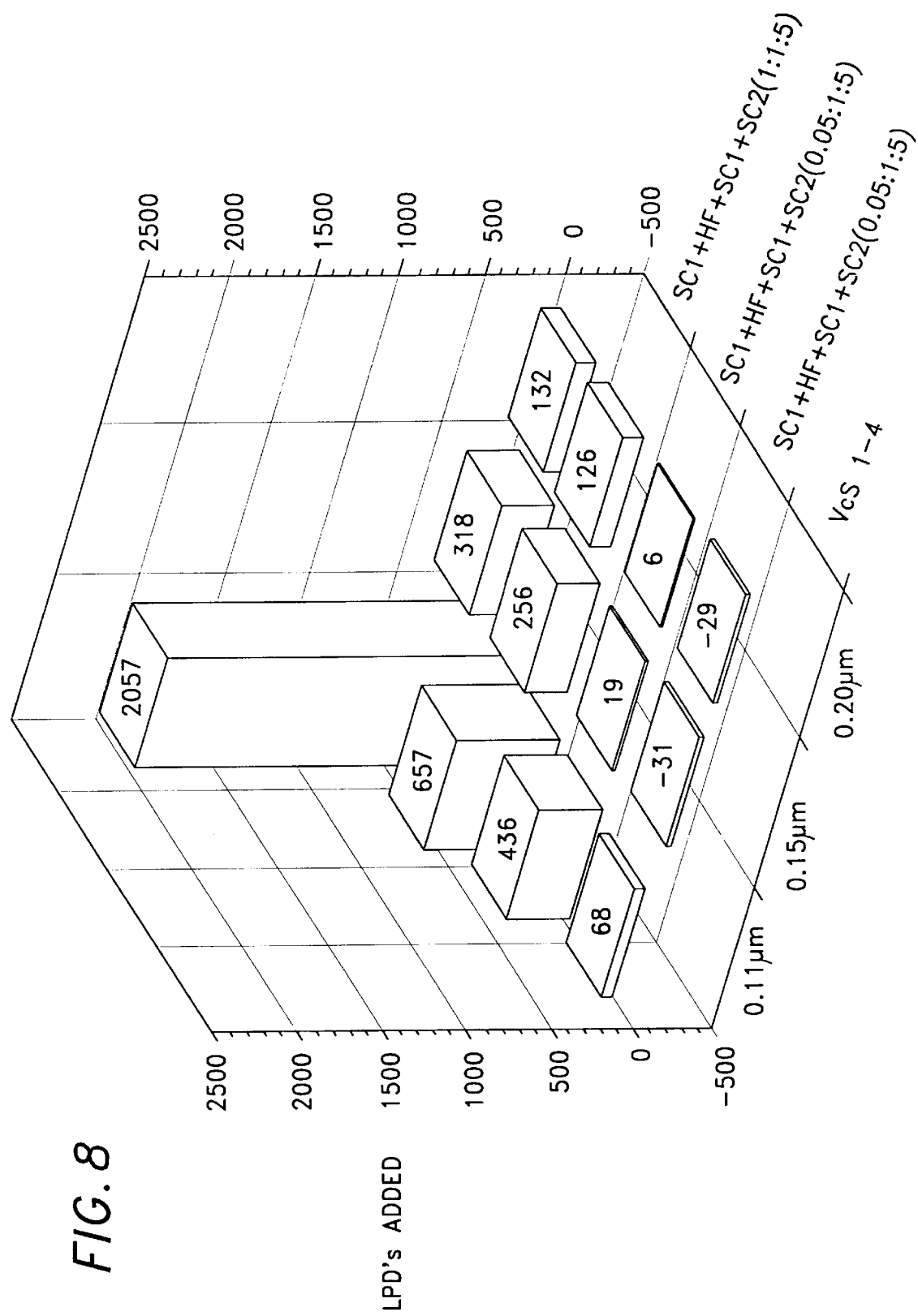
FIG. 8 is a pictorial graph illustrating particle removal performance comparisons of the process of the invention with conventional and state-of-the-art RCA cleans.

In determining the effectiveness of the VcS process, tests have been performed to compare the particle removal capability with that of the well-known SC-1 and SC-2 systems on clean wafers. This is illustrated in a three-dimensional graph in FIG. 8, wherein one horizontal axis indicates the different particle sizes of 0.11 micron, 0.15 micron, and 0.20 micron; the other horizontal axis indicates the various cleaning cycles; and the vertical axis indicates the "particles," that were added to so-called clean wafers when subjected to the processes indicated. The numerical values shown in the boxes are the average of these tests. It should be noted that the "particles" are identified by a laser light technique, and are commonly referred to in the industry as light-point defects or LPDs. Thus, the vertical axis actually indicates the light points observed, which in many instances are particles, particularly the large sizes. Even if some of the light points are actually roughness points on the wafer, that too is an undesirable defect added by the cleaning processes.

The back row of the graph shows the results obtained with the RCA clean system with its conventional SC-1 ratio of 1 part $H_2O_2$, one part $NH_4OH$, and five parts water, and SC-2 ratio of 6 $H_2O$: 1 $H_2O_2$: 1HCl. Such system uses the conventional overflow rinsing steps, as discussed above, without the use of megasonic energy during the rinse. However, megasonic energy could be used during the SC-1 sequence. As can be seen, 132 defects at the 0.2-micron level were observed as being added to clean wafers, 318 defects above the 0.15-micron level were observed, and 2,057 defects were detected above the 0.11-micron level. Frequently, defects are measured no lower than 0.25 microns, and the number of defects detected at that level may be quite small, such that the wafer may be considered clean by old standards.

The second row from the back of the graph employs the same RCA clean approach, except that the $NH_4OH$ component in SC-1 is diluted to 0.05 in relation to one part $H_2O_2$ and five parts water. As may be seen, the results are slightly better than the standard system at the 0.2-micron and 0.15-micron levels and are considerably better at the 0.11-micron level where only about one-third as many defects were added as with the normal concentrated approach. This graph then illustrates the value of the more dilute concentration of $NH_4OH$ with regard to surface microroughening, which is thought to be what the Tencor 6200 is identifying at the 0.11$\mu$ sensitivity, as has been indicated by Professor Ohmi and others.

The row on the graph second from the front also uses the dilute form of the RCA clean, but in addition, megasonic energy and the quick-dump rinse treatment was utilized during the final rinse cycle. As can be seen, this produced much better results in that only six defects were added at the 0.2-micron level and only 19 were added at the 0.15-micron level. The reduction to 435 defects at the 0.11-micron level in contrast to 657 without the megasonic is also a significant improvement, but not as dramatic as at the 0.15- and 0.20-micron levels. Thus, this test indicates the value of the quick-dump rinse with megasonic energy being applied.

As can be seen from the front row of the graph, the VcS system actually reduced the number at defects of the 0.2 micron level by 29. Likewise, it reduced the number of defects at the 0.15 micron level by 31. Further, even at the extremely small particle size of 0.11 microns, only 68 defects were added. The chart of FIG. 8 thus illustrates the dramatic difference between the VcS system and the standard RCA clean system. Further, it illustrates the importance in the present invention of the use of dilute chemistries, the use of megasonic energy, the megasonic quick dump and rinse cycles, as well as the sophistication of the Vc3 sequence, which is what is responsible for the extremely low defect count at 0.11μ.

Similar tests have also been conducted with regard to the cleaning efficiency of merely the Vc1 cycle, which is the primary particle removal cycle. In cleaning wafers having heavy contamination of silicon nitride, the Vc1 step eliminated most of the particles at 0.15 microns and above. In a specific test, the contaminated wafers had an average of over 2200 particles, and after cleaning, they had an average of about 15 particles. This represented the removal of more than 99 percent of the particles. With the megasonic off, the cleaning capability was not very effective (less than 3% removed).

In another test, silicon nitride particles were deposited on "clean" wafers having an average of 258 particles at 0.11μ. This raised the particle count to about 1500. After the Vc1 clean, the average dropped to about 130 at 0.11μ for a cleaning efficiency of >100% removal. That is, the wafers were cleaned to a level better than that before the deposition.

A similar test was conducted with respect to wafers contaminated with HF. The wafers in a particular test had an average of a little under a thousand particulates before cleaning at the 0.15-micron level and above, and after cleaning with simply the Vc1 cycle, four particles at the 0.15-micron level and above remained. An HF-contaminated wafer subjected to the standard SC-1 cleaning cycle with megasonic on reduced the number of particles from a little more than a thousand to about 60. This is quite good, but not as good as the Vc1 cycle.

Wafers having various other types of contamination have also been cleaned by the various processes. The contamination types included buffered oxide etch, photoresist strip (ash+piranha) and nitric acid. In all cases the processes of the invention were better in particle removal efficiency and as good as or better than those of the traditional chemistries with regards to gate oxide integrity (GOI) testing. Further, in most cases the efficiency of the cleaning with simply VC1, 2, and 3 was almost as good as with VC1–4 added. It should be kept in mind that even if cleaning results with the VcS system were only as good as the RCA system, the VcS system is very desirable because of all the other advantages mentioned.

As noted above, the Vc1 and Vc2 cycles remove particles and oxides, and the Vc3 step is intended to grow metal-free, particulate-free oxides. While the chemicals create the oxides, metal impurities can become entrained as a part of the oxide. The metals can cause failures in the circuitry to be formed from the wafer. By keeping the metals out of the oxide, a purer oxide is obtained. Thus, pure chemicals are desired. The dilute nature of the chemicals utilized in the VCS system, of course, results in fewer metals in the liquid applied to the wafers. SC-1 is believed to have been the worst contributor of metals into the processes. One of the purposes of utilizing SC-2 is to remove metals that may remain after the SC-1 process step.

New techniques have been developed for analyzing wafers to detect the presence of metals. In one such technique, the oxide is removed from the wafer and the oxide is then analyzed to see what is in that oxide. This technique is referred to as vapor phase decomposition inductively coupled plasma mass spectrometry (VPD) (ICP-Ms).

Thus, wafers have been taken directly out of an HF bath that strips off the oxide, and then tested to determine what "background" metals exist on the surface (control). Some of such test wafers were then subjected to an SC-1 and SC-2 process, and some were subjected to the VcS process. The wafers were then tested to see what metals have been added by these processes.

The testing was conducted at Balazs Analytical Laboratory, in Sunnyvale, Calif. The silicon wafer was placed in a box saturated with HF vapor and the oxide layer on the wafer is allowed to react with the HF vapor. Then, the trace metallic impurities on and in the oxide are collected with a small amount of ultrapure acid. The solution is analyzed for trace metals by Flow Injection ICP-MS. In the analysis, the metallic atoms are actually being counted, and the results shown are in units of $10^{10}$ atoms per $cm^2$ of surface area. Sample preparation steps were carried out in a clean room environment to minimize contamination.

The results of the testing may be seen in the chart set forth below. The sample metals are listed in a horizontal line at the top of the chart. The processes used are set forth in the left-hand column, and the results for five different tests are averaged and shown at intersections of the lines and columns.

| Metal | Na | Al | Cr | Fe | Ni | Cu | Zn |
|---|---|---|---|---|---|---|---|
| Detection Limit | <10 | <5 | <1 | <5 | <0.3 | <1.5 | <2 |
| (1) Control | <10 | <5 | <1 | <5 | .4 | 1.7 | 3 |
| (2) SC-1/SC-2 | 20 | <5 | <1 | <5 | .6 | 2.6 | <2 |
| (3) VcS (Vc 1–4) | 11 | <5 | <1 | <5 | .4 | 1.8 | <2 |
| (4) SC-1 (Contam.) | 16 | >1000 | <1 | 74 | 28 | 130 | 14 |
| (5) SC-1/SC-2 | <10 | <5 | <1 | <5 | 1.5 | 36 | <2 |
| (6) VcS (Vc 1–4) | 10.4 | <5 | <1 | <5 | <0.3 | 1.5 | 2.3 |
| (7) VcS (Vc 1–3) | 24 | 5.6 | 1.1 | 5.3 | .48 | 1.5 | 3.7 |

Test (1) shows a control wafer that was analyzed directly after being subjected to the HF vapor. Three tests were taken and averaged. Thus, the results on that line represent the control for later treatments to see whether metals have been added or removed by later tests. The bare wafer is essentially at the detection limit indicated by the "<" symbol for most of the elements being considered. In some cases it is slightly higher, but in essence the results show that the bare silicon is clean, to the detection limit of the instrument. Thus, in the first test the control wafer had less than 10E10 atoms of sodium. Some readings, such as for nickel, are less than 1, which is into the $10^9$ area. Test (2) shows that the SC-1/SC-2 treated wafers are essentially at the detection limit for all elements evaluated except for Na, where SC-1/SC-2 shows the number 20E10. The rest of the numbers are comparable to the control wafers in test (1). It should be noted that sodium is very hard to control since it is ever present, being on skin, hands, and many other surfaces.

Turning to test (3), it may be seen that the VcS system also does very well, being essentially at the detection limits. Five samples were taken and averaged, with a result very near the detection limit for all elements. This shows the overall background level for the VcS system to be metal free.

Test (4) shows the test results for an average of three samples after having been subject to a contaminating SC-1 step. In other words, test line 4 represents the control for the remainder of the test lines wherein various process steps were applied to the contaminated wafer of line 4. It can be seen that a large quantity of aluminum was added by the SC-1 treatment. Three samples were averaged for aluminum, two of which indicated the amounts were in the thousands, too large to measure with the instrument employed. Other significant increases occurred in Fe, Ni, Cu, and Zn, all important contaminants to device performance.

Test (5) shows the contaminated samples for test (4) being subjected to an SC-1 and SC-2 sequence and it can be seen that the SC-2 cycle is effective at removing aluminum, iron and zinc, however not as effective for copper and nickel.

Line (6) shows the results of the average of three samples cleaned with the VcS process tool over an extended period with steps 1–4. It shows that the VcS sequence did extremely well. It can be seen that the large quantity of aluminum was reduced to the detection level similar to the levels attained by the SC-1/SC-2 sequence. Further, with regard to nickel and copper, the VcS sequence performed even better than the SC-1/SC-2 test, taking these elements to the detection limits as well.

In the sequence for test (7), steps 1, 2, and 3 of the VcS system were performed on three samples during an extended period and averaged. The Vc2 cycle includes an HF step where oxide is being removed and hence good results are obtained throughout. The Vc3 sequence in essence is very much like Vc1 in the sense it has the same chemicals. Therefore, if the chemicals are dirty, a few metals would have been added. However, metals were not added which indicates that the chemistry is sufficiently pure primarily due to the extremely high dilution rates employed in the sequence.

As an illustration of the cost saving of a particular system of the invention, below is the estimated cost of chemical consumption for one year comparing a state-of-the-art traditional pre-diffusion cleaning system in comparison to the VcS prediffusion cleaning system. The state-of-the-art traditional system employs multiple tanks, with the wafers being moved from tank to tank, concentrated chemicals, non-megasonic overflow or dump rinsing, and no megasonic energy provision in cleaning baths, except for the SC-1 approach. The estimates are based on one year's operation, cleaning the same number of wafers (5,000 wafer starts per week processed through the tool four times).

| Chemical Consumption | Dollars |
|---|---|
| Traditional System | |
| DI rinse water | 603,000 |
| HF | 260,000 |
| $H_2O_2$ | 205,000 |
| $NH_4OH$ | 46,000 |
| HCl | 68,000 |
| $H_2SO_4$ | 150,000 |
| TOTAL | 1,332,000 |
| VcS SYSTEM | |
| DI rinse water | 165,000 |
| Vc1 | 32,000 |
| Vc2 | 2,000 |
| Vc3 | 73,000 |
| Vc4 | 14,000 |
| TOTAL | 286,000 |

As can be seen, the traditional system has almost 4½ times the expense of the VcS system. Aside from the cost of the materials, water conservation is also very important. The traditional system outlined above employs about 12 million gallons per year whereas the VcS system employs less than a quarter of that per year. Also, the figure for the traditional system only includes the rinse DI water and does not include the DI water that is in the chemical mixtures.

In addition to the consumables, the primary additional cost saving with the VcS system concerns the cost of equipment. Various other expenses are approximately the same for the two systems; but just considering the equipment and consumables, the standard system in the above example has a cost of $2.36 per wafer for equipment and $5.83 for consumables. By contrast, the VcS system costs $1.31 per wafer for equipment and $1.22 for consumables. This makes the VcS system 44% less expensive than the standard system for equipment and almost 80% less for consumables. Adding in the other costs of ownership such as material, maintenance, labor, support personnel, support services, and administrative costs which are about the same for the two systems makes the VcS system 55% less costly than the standard system. Stated differently, the VcS system in the above estimate represents a savings of over $1,400,000 per year in the cost of ownership. Further, that does not consider the improvements in yield obtained from the VcS system over the standard system.

Other Uses of the VcS System

While the process outlined above is a preferred procedure for pre-diffusion cleaning, other pre-diffusion steps may be followed employing the VcS solutions. For example, a standard step of using Piranha in a separate tank, followed by appropriate VcS rinsing, a standard hydrofluoric acid cleaning step and further rinsing, followed by the use of the Vc3 cycle in the manner outlined above. Those three steps by themselves are adequate in many situations.

Further, in some processes, the use of the Vc1 solution by itself will provide results as good as that obtained by using the sequence of a Piranha cleaning step, a conventional hydrofluoric acid and a conventional cleaning step, followed by the use of SC-1 and SC-2. The use of the Vc1, Vc2 and Vc3 cycles provide excellent results even without the use of the Vc4 cycle. As another variation, hydrogen peroxide in a very diluted amount could be added to Vc4 cycle to increase the oxidation state of the HCl but this is rarely needed as long as the prior Vc1, 2, and 3 steps are employed. Also effective cleaning steps could, in some cases, utilize Vc1 only, Vc1 and Vc4, or Vc1 and Vc2.

Another pre-diffusion step for wafers is that of scribing the wafers with laser energy. After that process, wafers are commonly cleaned employing SC-1. The Vc1 procedure outlined above is very suitable for this purpose.

While the highly dilute cleaning processes and uses of VcS system described above are primarily useful for pre-diffusion cleaning, the methods and solutions are useful for other stages of semiconductor wafer processing.

After the diffusion procedure, it is often necessary to have a chemical/mechanical polishing procedure; and after that, it is again necessary to clean the wafers. The VcS cycles outlined above are well-suited for this purpose. In addition, another procedure has been developed for such post-mechanical-chemical cleaning (CMP).

Dielectric Isolation Post-CMP Cleaning (Vc0 Process

The wafers are received from the chem mechanical polish process immersed in a surfactant solution. The wafers have a relatively thick thermally grown or CVD oxide remaining after the polish. One example tested on the VcS tool has been 4300 A, other thicknesses have been seen and depend upon the custom process.

Figure 9:
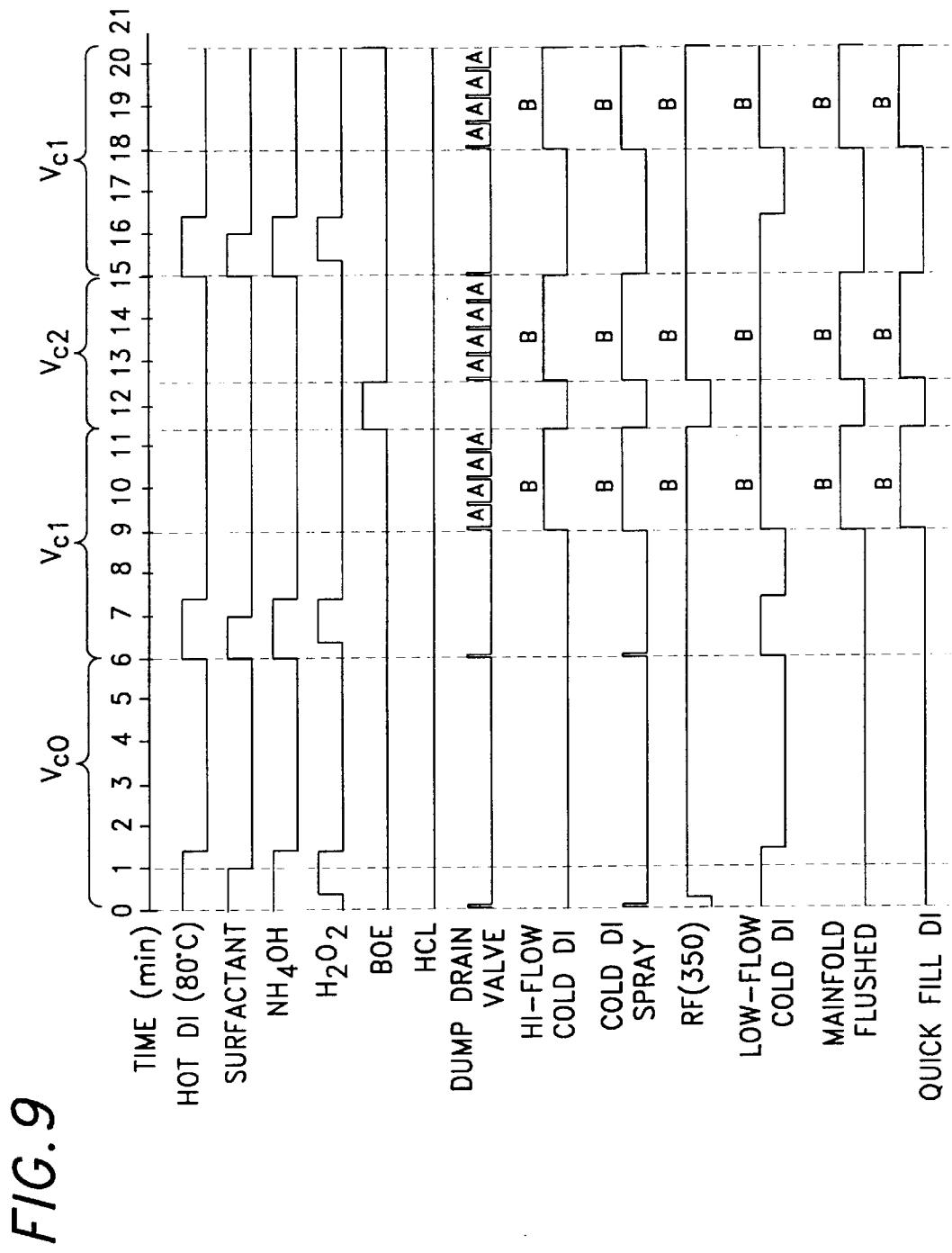
FIG. 9 is a timing diagram of a post CMP cleaning procedure for wafers having a thermal or a deposited oxide film.

The CMP cleaning process has been designed to clean the contaminants off the surface while only thinning the oxide by approximately 30–50 A. FIG. 9 is a timing diagram illustrating the post CMP clean sequence for wafers having thermal or chemical vapor deposition (CVD) oxide thereon after the completion of the CMP process. In a Vc0 cycle at the start of the process, hot DI water is introduced to a 16 liter tank at a relatively high flow rate of about 16 liters per minute at a temperature of about 80° C. The dump drain valve is initially open and the DI spray water is on. As seen from the diagram, the valve is closed and the DI spray is stopped after a few seconds. $NH_4OH$ is introduced through the manifold at a rate of about 380 cc per minute together with metered low flow DI water through the manifold. After about 24 seconds, $H_2O_2$ is introduced at a flow rate of about 106 cc per minute. This injection continues for 1 minute and the $NH_4OH$ injection also terminates at that point as does the hot DI water and the slow flow DI water through the manifold. The solution should then be about 60° C. and have a final mix ratio of approximately 200 $H_2O$, 1 $H_2O_2$ and 5 $NH_4OH$. Megasonic energy is turned on during the filling of the tank once the megasonic transducer is covered. Power is preferably set at about 350 watts or 30 watts per square inch of transducer surface. Once the tank is full, the wafers are inserted in the megasonically active solution and allowed to clean for about 5 minutes with megasonic energy continuing.

At the end of that 5 minute period, completing the Vc0 cycle, a Vc1 cycle as described above is commenced. This starts with a single dump of the tank and the introduction of hot DI water to fill the tank with Vc1 chemistry described above. At the completion of the Vc1 cycle, a modified Vc2 step commences. This dilute HF mixture is designed to remove approximately 30 A° of oxide (leaving approximately 4300 A°, depending on the device being cleaned). At the end of a 1 minute etch step, the HF is turned off and high flow and quick fill DI water flow commences, and the quick dump and rinse steps start. The megasonic energy is turned on to aid in the rinse efficiency. This is one significant difference between the Vc2 cycle discussed above in which the megasonic energy was not turned on at that stage. Since the wafer has a protective oxide surface, the use of the megasonic energy does not damage the wafer as it would in other DHF etches where all of the oxide is removed and bare silicon is exposed. Note also that the rinsing time is shortened with the quick dump rinse steps with megasonic energy applied. After the Vc2 cycle, the Vc1 sequence is used once more to replace the normal post-DHF, Vc3 sequence, since there is an oxide protective surface on the wafer. The Vc3 sequence is specifically designed to regrow a native oxide on a "bare silicon" surface without affecting the surface microroughness negatively. The Vc1 cycle is a faster clean, since it is more concentrated than the Vc3 chemistry. The final megasonic, quick dump rinse is begun at the end of the second Vc1 clean cycle. The process terminates in a megasonic overflow where the wafers are removed through a megasonically active surface and dried in an appropriate dryer.

Post CMP Cleaning For Bare Silicon Wafers (VcB Process)

Figure 10:
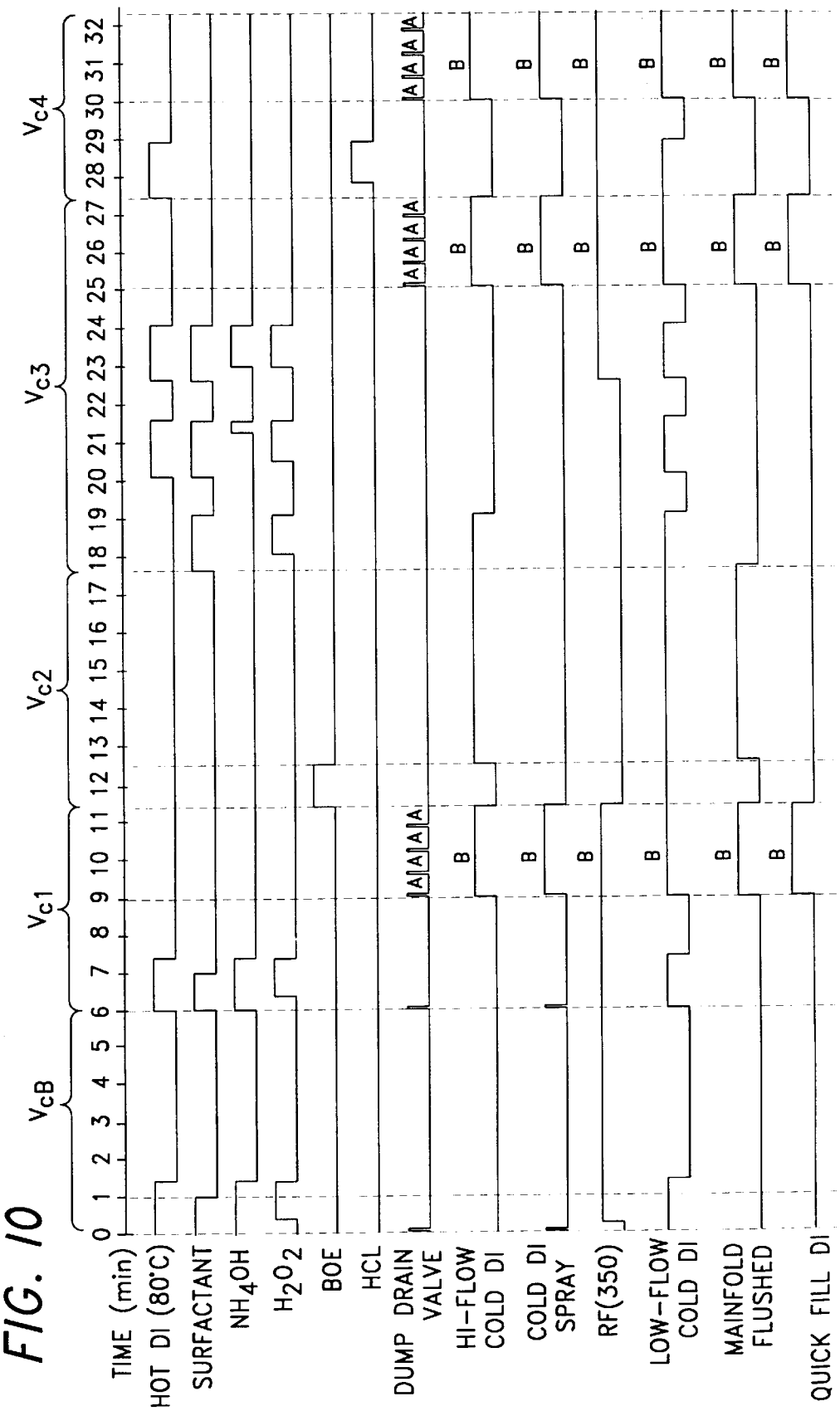
FIG. 10 is a timing diagram of a post CMP cleaning procedure for "bare" silicon wafers.

Some wafers receiving the CMP cleaning have a "bare silicon" surface. This term is used to indicate no oxide, but in practice a thin coating of native oxide is usually quickly formed even if all oxide was removed in the CMP process. Such wafers may also be then cleaned utilizing a variation of the VcS system. The first cycle, which may be termed VcB is similar to the Vc0 cycle but with an important difference. As seen from the timing diagram in FIG. 10, the cycle commences with hot DI water and with the introduction of $NH_4OH$. $H_2O_2$ is also introduced at the same time. The $NH_4OH$ is introduced at a rate of about 220 cc per minute and the $H_2O_2$ is introduced at approximately the same rate. This creates a final mix ratio of about 75 $H_2O$ to 1 $H_2O_2$ and about 1 $NH_4OH$. This higher concentration chemistry acts to remove the polishing compound left on the wafer from the polishing step. However, because the wafer has essentially no oxide on it immediately after the polish step, it is necessary to introduce a higher concentration of hydrogen peroxide than for the Vc0 process to prevent the ammonia from producing undesirable roughening. This was not required for the thermal oxide coated wafers because the oxide provided a protective coating. As with the VcO cycle, however, megasonic energy is applied to the solution as soon as the transducer is covered with liquid.

The VcB cycle is followed by the Vc1, Vc2, Vc3, and Vc4 cycles as described above. As mentioned above, the Vc3 sequence is specifically designed to regrow a native oxide on a bare silicon surface without affecting the surface microroughness negatively. Thus, with the post CMP clean for bare silicon wafers, the Vc3 step is required rather than a repeat of the Vc1 cycle.

In yet another example for using the VcS system, it is necessary to clean wafers after the desired conductive metals have been added to them. The use of the Vc3 cycle in the manner outlined above is quite effective for this purpose. Further, in some cases, merely using deionized water with surfactant in the range of 10–50 parts per million is satisfactory together with the use of megasonic energy. While the use of water with surfactant has been previously used for so-called post-metal cleaning, the surfactant amount has been as much as 100–1000 parts per million in relation to the water, vastly more than that outlined above. Again, the use of a high purity surfactant together with megasonic energy is believed to be responsible for these improved results.

Another use for the VcS cycles or Vc1 and Vc4 only is in connection with the cleaning of so-called monitor wafers. In many wafer processing steps, it is common practice to utilize a monitor wafer that has not received all of the process steps that the other wafers have received. Its cleanliness is known before a particular procedure is to be followed and is then checked after that procedure so as to monitor the activities that occurred at that time. These monitor wafers must also be cleaned. Many facilities have a separate station just for cleaning monitor wafers. Because of the extremely low haze producing nature of VcS chemistries, especially Vc1 and Vc4, the life expectancy of monitor wafers can be greatly increased. (Tests have shown as much as 20 times more life than with concentrated chemistry.) This significantly reduces the need to buy new monitor wafers.

Alternative System for Vc2 Cycle

As mentioned above, the hydrofluoric acid of the Vc2 cleaning cycle currently requires special handling since the hydrofluoric acid cannot be dumped down a regular drain because of environmental considerations, even though the solution employed is greatly diluted, and because as greater amounts of oxide need to be removed, more concentrated DHF mixtures are required.

Rather than transferring the liquid to another tank as discussed above, another approach is to remove the wafers from the primary cleaning tank to a separate tank for the hydrofluoric acid processing step. This has the advantage of being fairly simple and of allowing for the easy reuse of the solution. It has, however, the great disadvantage of removing the wafers to the separate tank and then returning them to the original tank. In order to utilize HF in a single tank without streaking of wafers, it is preferable that the HF solutions be removed quickly from the process tank, and returned quickly to the tank.

Figure 6:
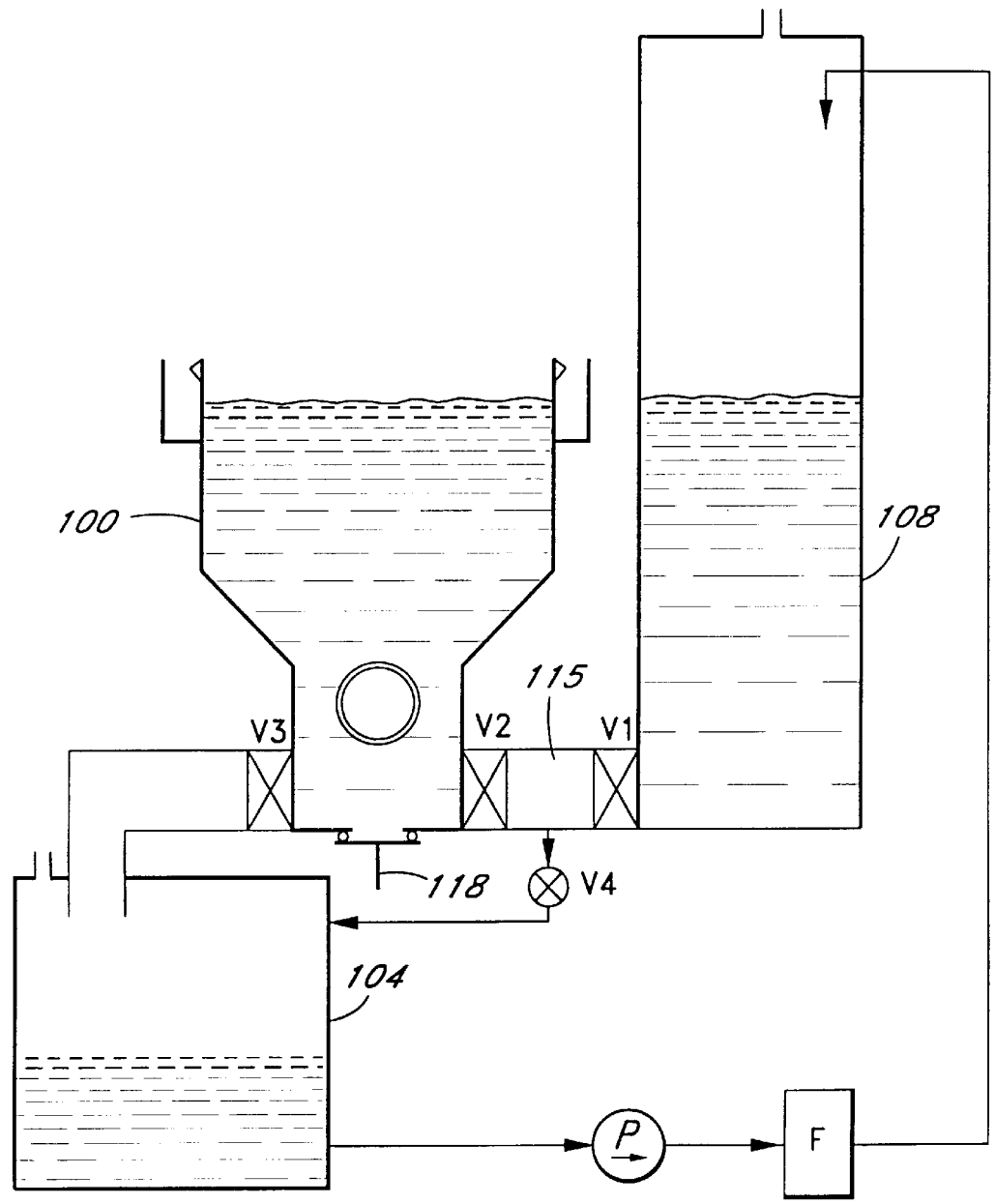
FIG. 6 is a schematic view of a process tank with quick-dump and quick-fill reservoirs useful for an alternate arrangement for the Vc2 cycle.

There is schematically illustrated in FIG. 6 an alternative system in which the hydrofluoric acid cleaning step can be performed in the main process tank. The tank 100 is the same as that shown in FIG. 1, except that it has the additional connections shown in FIG. 6. The significant difference is that a large outlet valve V3, allows the tank 100 to empty quickly into a reservoir 104 situated at a level below the process tank. Further, the tank is provided with a large inlet valve V2, and is connected to a fill reservoir 108 positioned adjacent the process tank 100, with its lower end about level with the bottom end of the process tank, while its upper end extends about twice the height of the process tank. The lower reservoir 104 has a volume sufficient to hold at least the contents of the process tank 100, and preferably three times the process tank volume. The fill reservoir 108 has a volume about twice that of the process tank volume with half the volume being above the process tank, as shown in FIG. 6. A pump P is connected to the lower end of the lower reservoir and to the upper end of the fill reservoir through the schematically illustrated filter F.

The outlet valve V3 and the inlet valve V2 extend along a substantial length of the process tank so that the tank contents can be dumped quickly and refilled quickly. The valves are provided with suitable seals and opening and closing controls (not shown).

Also provided is a valve V1 at the base of the fill reservoir 108 and at the entry of a large conduit 115 leading to the fill valve V2. In addition, a valve V4 permits the draining of the conduit 115 to the lower reservoir 104.

In use of the system in FIG. 6, assume that the desired diluted hydrofluoric acid solution is in the fill reservoir 108, the contents being near the upper end of the reservoir such that the volume is twice that of the process tank 100. Assume also that all of the valves are closed except the drain valve 118 in the bottom of the tank. The tank has been properly rinsed, and the Vc2 cycle is about to commence. The drain valve 118 is then closed and the valves V1 and V2 are opened. Liquid then very quickly flows from the fill reservoir 108 into the process tank 100, filling the process tank while the reservoir level drops to that of the liquid in the process tank. With the size of the inlet into the tank and the size of the valve contemplated, the tank will fill in a few seconds. The inlet valves V1 and V2 are then closed, and the Vc2 process proceeds.

At the end of the process time, the outlet valve V3 is opened, causing the process tank contents to quickly dump into the lower reservoir. When the process tank is empty, the outlet valve V3 is closed, and the drain valve V4 is opened. The tank and its contents can then be subjected to the normal deionized water spray and the deionized water fill with the drain valve 118 open. After about 10 seconds, the drain valve 118 can be closed. The process tank can then be subjected to as many of the normal quick dump and rinse cycles as desired. While this is occurring, the pump P pumps the contents of the lower reservoir 104 to the upper reservoir, so that the system is set for another quick refill and dump sequence. The Vc2 solution can be filtered by the filter F.

While the diluted buffered oxide etchant, referred to above, is the preferred material for the HF step, ultra dilute HF with a surfactant may be effectively employed. Alternatively, ultra dilute HF with a small amount of isopropyl alcohol (IPA) may be utilized.

Figures 11, 12:
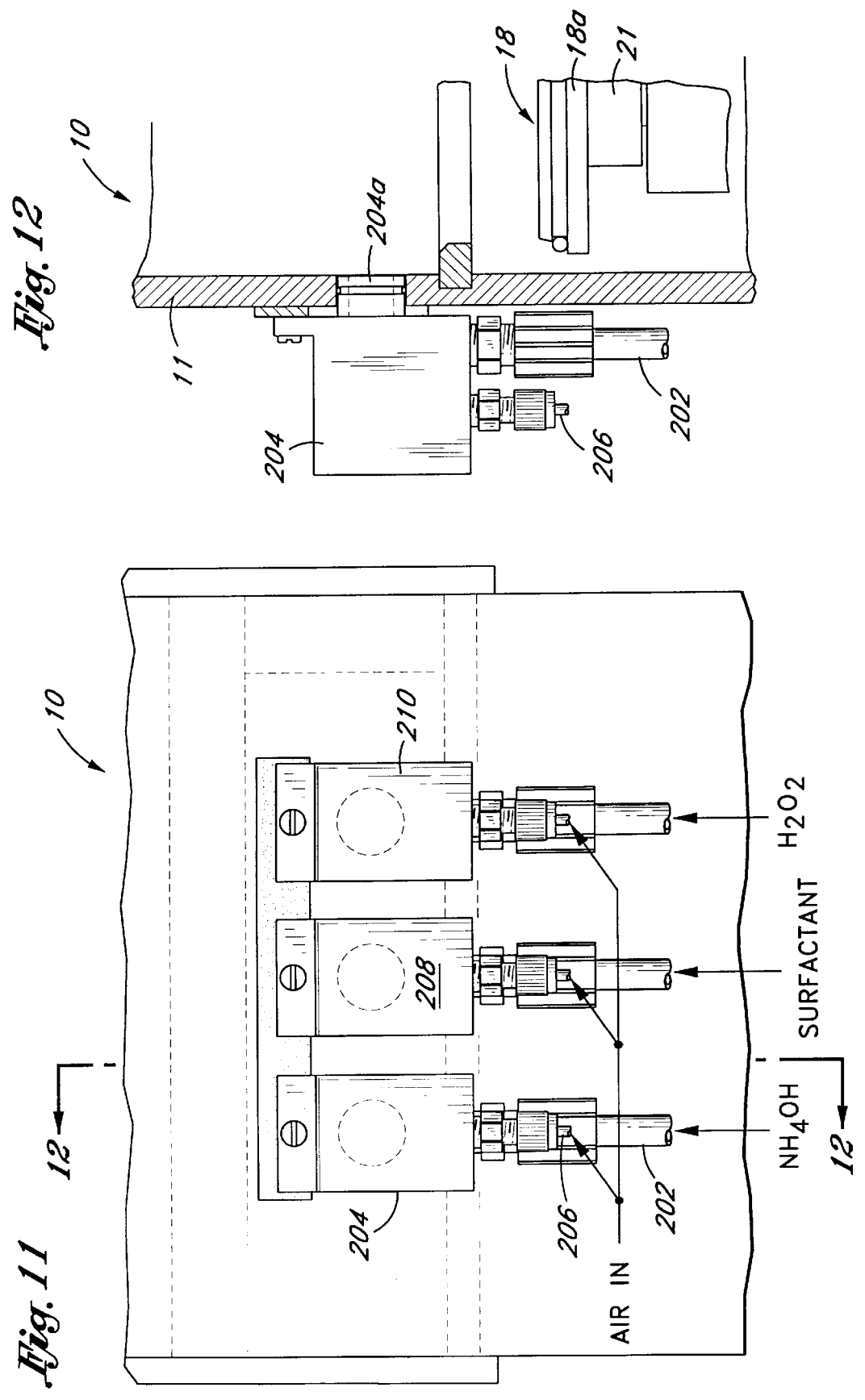

FIGS. 11 and 12 Alternative Apparatus

Instead of injecting the chemicals into a manifold and then into a DI water conduit leading to the tank as shown in FIG. 3, the chemicals are directly injected into the tank in FIGS. 11 and 12. More specifically, an inlet conduit 202 connects a supply of $NH_4OH$ to a suitable, commercially available injection valve 204 mounted to a side wall of the tank 10. The valve 204 is air operated by way of a suitable air inlet line 206. As seen in FIG. 12, the valve 204 includes an outlet conduit 204a extending through a hole in the tank wall 11, with a suitable seal. The outlet conduit 204a is located in the lower part of the tank 10 at approximately the same height as the water inlets. Thus the incoming chemical mixes thoroughly with the incoming water and rises upwardly, as with the arrangement of FIGS. 1–3.

Also mounted in the tank side wall is an air operated injection valve 208 connected to a source of surfactant and a similar valve 210 connected to a source of $H_2O_2$.

An advantage of mounting the metering valves directly on the tank is that simpler and more precise control is obtained than with the manifold. With direct injection, it is not necessary to consider the effect of the manifold on the system, nor the flushing of the manifold lines, nor the connections to the DI water lines.

What is claimed is:

1. Apparatus for cleaning semiconductor wafers comprising:

a tank;

one or more deionized water inlets in the lower portion of the tank;

a plurality of inlets in a wall of the tank, separate from the water inlets, for injecting directly into the lower portion of the tank small quantities of chemicals, including an inlet for ammonium hydroxide and an inlet for hydrogen peroxide, to mix with the water to create a very diluted cleaning solution;

a valve immediately adjacent each of said inlets for said chemicals for controlling the injecting of said chemicals into said tank;

a megasonic generator positioned in said tank to direct megasonic energy into the solution, said generator being in a lower part of said tank so that megasonic energy can be applied as the tank is filling;

a support for supporting semiconductor wafers with respect to the megasonic generator so that both sides of each of the wafers are subjected to cleaning solution agitated by megasonic energy;

one or more dump valves in the lower portion of said tank for quickly dumping cleaning solution from the tank; and spray nozzles located in said tank for spraying the wafers and the tank walls.

2. The apparatus of claim 1, including a diffuser in said tank below said megasonic generator and above said water inlets to inhibit splashing.

3. The apparatus of claim 2, wherein said chemical inlets are beneath said diffuser.

4. The apparatus of claim 1, wherein said cleaning solution comprised one part ammonium hydroxide, two parts hydrogen peroxide, about 300 parts deionized water and about 10 to 50 parts per million surfactant.

5. The apparatus of claim 1, wherein said solutions comprises 1 HF:5 $NH_4F$ and about 600 parts deionized water.

6. The apparatus of claim 1, wherein said solution comprises one part ammonium hydroxide, two parts hydrogen peroxide, about 400–1000 parts deionized water and about 14 parts per million of a surfactant.

7. The apparatus of claim 1, wherein the solution comprises one part hydrochloric acid to about 1000 parts deionized water.

8. The apparatus of claim 1, wherein said tank has side walls spaced slightly more than the diameter of the wafers, and said tank has side wall portions that slope downwardly and inwardly to define a lower portion narrower than the wafer diameter.

9. The apparatus of claim 1, wherein said one or more deionized water inlets include a water inlet on each of two opposite ends of the tank to promote uniform mixing of the water in the tank.

* * * * *